US012652920B2

(12) United States Patent
Cheon et al.

(10) Patent No.: US 12,652,920 B2
(45) Date of Patent: Jun. 9, 2026

(54) DISPLAY DEVICE

(71) Applicant: Samsung Display Co., LTD., Yongin-si (KR)

(72) Inventors: Soo Hong Cheon, Yongin-si (KR); Kye Uk Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/956,852

(22) Filed: Nov. 22, 2024

(65) Prior Publication Data

US 2025/0318386 A1      Oct. 9, 2025

(30) Foreign Application Priority Data

Apr. 4, 2024     (KR) ........................ 10-2024-0045753

(51) Int. Cl.
| | |
|---|---|
| *H10K 59/131* | (2023.01) |
| *G09G 3/32* | (2016.01) |
| *G09G 3/3233* | (2016.01) |
| *H10H 29/14* | (2025.01) |
| *H10K 59/121* | (2023.01) |
| *H10K 59/126* | (2023.01) |

(52) U.S. Cl.
CPC ........... *H10K 59/1315* (2023.02); *G09G 3/32* (2013.01); *G09G 3/3233* (2013.01); *H10H 29/142* (2025.01); *H10K 59/1213* (2023.02); *H10K 59/1216* (2023.02); *H10K 59/126* (2023.02); *G09G 2300/0426* (2013.01); *G09G 2300/0819* (2013.01); *G09G 2300/0852* (2013.01)

(58) Field of Classification Search
CPC ........... H10K 59/1315; H10K 59/1213; H10K 59/126; H10K 59/1216; H10H 29/142; G09G 3/32; G09G 3/3233; G09G 2300/0426; G09G 2300/0819; G09G 2300/0852

USPC .......................................................... 345/55
See application file for complete search history.

(56) References Cited

U.S. PATENT DOCUMENTS

| | | | | |
|---|---|---|---|---|
| 2025/0081728 A1* | 3/2025 | Kim | ..................... | H10K 59/124 |
| 2025/0081729 A1* | 3/2025 | Chae | .................... | H10K 59/131 |
| 2025/0089454 A1* | 3/2025 | Jeong | ................. | H10K 59/1213 |
| 2025/0126972 A1* | 4/2025 | Cho | .................... | H10K 59/1213 |

(Continued)

FOREIGN PATENT DOCUMENTS

KR          10-2274024          7/2021

*Primary Examiner* — Tom V Sheng
(74) *Attorney, Agent, or Firm* — F. CHAU & ASSOCIATES, LLC

(57) ABSTRACT

A display device includes, a first unit pixel including at least two light emitting elements, a second unit pixel including at least two light emitting elements, and a power line applying a voltage to the first and second unit pixels, the first and second unit pixels are side by side in a direction different from an extension direction of the power line, the power line includes first driving power lines, second driving power lines, an initialization power line, a first reference power line, and a second reference power line, the second driving power lines, the initialization power line, the first reference power line, and the second reference power line are each electrically connected to the first and second unit pixels through a wire, and the first driving power lines include wires electrically connected to each of the first unit pixel and the second unit pixel.

20 Claims, 16 Drawing Sheets

(56) References Cited

U.S. PATENT DOCUMENTS

| | | | |
|---|---|---|---|
| 2025/0133921 A1* | 4/2025 | Yi ..................... | H10K 59/1213 |
| 2025/0160144 A1* | 5/2025 | Shin ................... | H10K 59/131 |
| 2025/0160149 A1* | 5/2025 | Yoon ................. | H10K 59/1213 |
| 2025/0174190 A1* | 5/2025 | Park .................... | G09G 3/3233 |
| 2025/0212605 A1* | 6/2025 | Cha .................... | H10K 59/124 |
| 2025/0232711 A1* | 7/2025 | Shim .................. | G09G 3/3233 |
| 2025/0234708 A1* | 7/2025 | Kim .................... | H10K 59/131 |
| 2025/0246141 A1* | 7/2025 | Kim .................... | G09G 3/3233 |
| 2025/0252919 A1* | 8/2025 | Shin ................... | G09G 3/3233 |

* cited by examiner

DISPLAY DEVICE

CROSS-REFERENCE TO RELATED APPLICATION(S)

This application claims priority to and benefits of Korean Patent Application No. 10-2024-0045753 under 35 U.S.C. § 119 filed on Apr. 4, 2024, in the Korean Intellectual Property Office, the entire contents of which are incorporated herein by reference.

BACKGROUND

1. Technical Field

The disclosure relates to a display device.

2. Description of the Related Art

The importance of display devices has steadily increased with the development of multimedia technology. Along with this trend, various types of display devices such as a liquid crystal display (LCD) device, an organic light emitting diode (OLED) display device and the like have been developed.

Among the display devices, a self-light emitting display device may include a self-light emitting element such as an organic light emitting element. The self-light emitting element may include two opposite electrodes and a light emitting layer disposed between the two opposite electrodes. Using the organic light emitting element as the self-light emitting element, the electrons and holes from the two electrodes are recombined in the light emitting layer to produce excitons, which transition from the excited state to the ground state, emitting light.

The self-light emitting display device is attracting attention as a next-generation display device because of being able to meet the high display quality requirements such as wide viewing angle, high brightness and contrast, and quick response speed as well as being able to be made having a low power consumption, lightweight, and thin due to no necessity of a power source such as a backlight unit.

As high-resolution display devices gradually emerge, the size of individual pixels is becoming smaller. Accordingly, the size of components constituting each pixel is gradually becoming smaller.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device in which the number of stacked circuit layers is minimized.

Aspects of the disclosure also provide a display device in which a pixel density is increased while securing an area of a capacitor.

However, aspects of the disclosure are not restricted to those set forth herein. The above and other aspects of the disclosure will become more apparent to one of ordinary skill in the art to which the disclosure pertains by referencing the detailed description of the disclosure given below.

According to an aspect of the disclosure, there is provided a display device that may include a first unit pixel including at least two light emitting elements; a second unit pixel including at least two light emitting elements; and a power line applying a voltage to the first unit pixel and the second unit pixel, wherein the first unit pixel and the second unit pixel are disposed side by side in a direction different from an extension direction of the power line, the power line may include first driving power lines; second driving power lines; an initialization power line; a first reference power line; and a second reference power line, the second driving power lines, the initialization power line, the first reference power line, and the second reference power line are each electrically connected to the first unit pixel and the second unit pixel through a wire, and the first driving power lines may include wires electrically connected to each of the first unit pixel and the second unit pixel.

In an embodiment, a number of the first driving power lines may be greater than a number of the second driving power lines.

In an embodiment, a voltage applied to the first driving power lines may be higher than a voltage applied to the second driving power lines.

In an embodiment, a width of each of the second driving power lines may be greater than a width of each of the first driving power lines.

In an embodiment, a width of each of the second driving power lines may be greater than a width of each of the initialization power line, the first reference power line, and the second reference power line.

In an embodiment, the display device may further comprise a plurality of data lines each applying a data signal to the at least two light emitting elements of the first unit pixel and the second unit pixel, wherein at least one power line may be disposed between the plurality of data lines.

In an embodiment, the display device may further comprise an auxiliary electrode extending in a same direction as the power line, wherein the auxiliary electrode overlaps the power line.

According to an aspect of the disclosure, there is provided a display device that may include a first unit pixel including at least two light emitting elements; a second unit pixel including at least two light emitting elements; a power line applying a voltage to the first unit pixel and the second unit pixel, and a horizontal power line extending in a direction different from an extension direction of the power line and electrically connecting the first unit pixel and the second unit pixel to the power line, wherein the first unit pixel and the second unit pixel are disposed side by side in a same direction as the extension direction of the power line, the horizontal power line may include first horizontal driving power lines; second horizontal driving power lines; a horizontal initialization power line; a first horizontal reference power line; and a second horizontal reference power line, the first horizontal reference power line and the second horizontal driving power lines are each electrically connected to the first unit pixel and the second unit pixel through a wire, and the first horizontal driving power lines, the horizontal initialization power line, and the second horizontal reference power line each include wires electrically connected to each of the first unit pixel and the second unit pixel.

In an embodiment, a number of the first horizontal driving power lines may be greater than a number of the second horizontal driving power lines.

In an embodiment, a disposition of the first horizontal driving power lines, the horizontal initialization power line, and the second horizontal reference power lines in the first unit pixel may be substantially symmetrical to a disposition of the first horizontal driving power lines and the horizontal initialization power line, and the second horizontal reference power line in the second unit pixel with respect to a first reference line, and the first reference line may be disposed between the first unit pixel and the second unit pixel, and may extend in a same direction as an extension direction of the horizontal power line.

In an embodiment, the first unit pixel and the second unit pixel may each comprise at least one capacitor having at least one capacitor electrode, and the capacitor electrode of the first unit pixel is substantially symmetrical to the capacitor electrode of the second unit pixel with respect to the first reference line.

According to an aspect of the disclosure, there is provided a display device that may include at least one transistor and at least one capacitor disposed on a substrate; at least one light emitting element disposed on the transistor and the capacitor, the at least one light emitting element including a first electrode, a light emitting layer disposed on the first electrode, and a second electrode disposed on the light emitting layer, and a power line applying a voltage to any one of the transistor, the capacitor, and the at least one light emitting element, wherein the power line may include first driving power lines applying a first voltage to the first electrode and second driving power lines applying a second voltage to the second electrode, and a number of the first driving power lines may be greater than a number of the second driving power lines.

In an embodiment, the first voltage may be a voltage higher than the second voltage.

In an embodiment, a number of the first driving power lines may be twice a number of the second driving power lines.

In an embodiment, a width of each of the second driving power lines may be greater than a width of each of the first driving power lines.

In an embodiment, the display device may further comprise, a plurality of data lines each applying a data signal to the at least one light emitting element, and a common electrode auxiliary electrode disposed in a same layer as the first electrode, wherein the common electrode auxiliary electrode comprises a plurality of shielding parts respectively overlapping the plurality of data lines.

In an embodiment, an extension direction of the plurality of shielding parts may be same as an extension direction of the plurality of data lines.

In an embodiment, the display device may further comprise, a first conductive layer disposed on the substrate, an active layer disposed on the first conductive layer, a second conductive layer disposed on the active layer, a third conductive layer disposed on the second conductive layer, and a fourth conductive layer disposed on the third conductive layer, wherein the at least one transistor comprises an active region, a source electrode, and a drain electrode, and a gate electrode disposed in the second conductive layer, the active region, the source electrode, and the drain electrode are disposed in the active layer, the at least one capacitor comprises capacitor electrodes respectively disposed on the first conductive layer, the active layer, the second conductive layer, and the third conductive layer, the power line may be disposed in the third conductive layer, and the first electrode of the at least one light emitting element is disposed in the fourth conductive layer.

In an embodiment, the display device may further comprise a horizontal power line disposed in the first conductive layer and extending in a direction different from an extension direction of the power line, wherein the horizontal power line may be electrically connected to the power line disposed in the third conductive layer through a contact hole.

In an embodiment, the at least one transistor and the at least one capacitor may be electrically connected to the power line through the horizontal power line.

In accordance with the display device according to an embodiment, the number of stacked circuit layers may be minimized.

In accordance with the display device according to an embodiment, it is possible to increase a pixel density while securing an area of a capacitor.

However, effects according to embodiments of the disclosure are not limited to those described above and various other effects are incorporated herein.

BRIEF DESCRIPTION OF THE DRAWINGS

The above and other aspects and features of the disclosure will become more apparent by describing in detail embodiments thereof with reference to the attached drawings, in which:

FIG. 15 is a schematic cross-sectional view of the display substrate taken along lines X3-X3' and X4-X4' of FIG. 9.

DETAILED DESCRIPTION OF THE EMBODIMENTS

Figure 1:
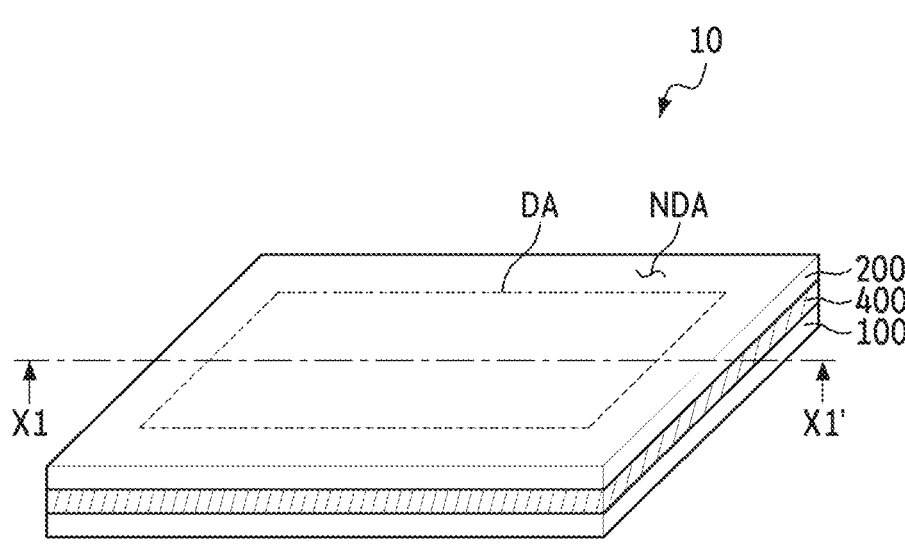
FIG. 1 is a schematic perspective view showing a display device according to an embodiment.
Figure 1:
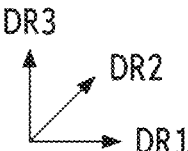

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will also be understood that when a layer is referred to as being "on" another layer or substrate, it can be directly on the other layer or substrate, or intervening layers may also be present. The same reference numbers indicate the same components throughout the specification.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "comprises," "comprising," "includes," and/or "including," "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Hereinafter, embodiments will be described in detail with reference to the accompanying drawings.

Figure 2:
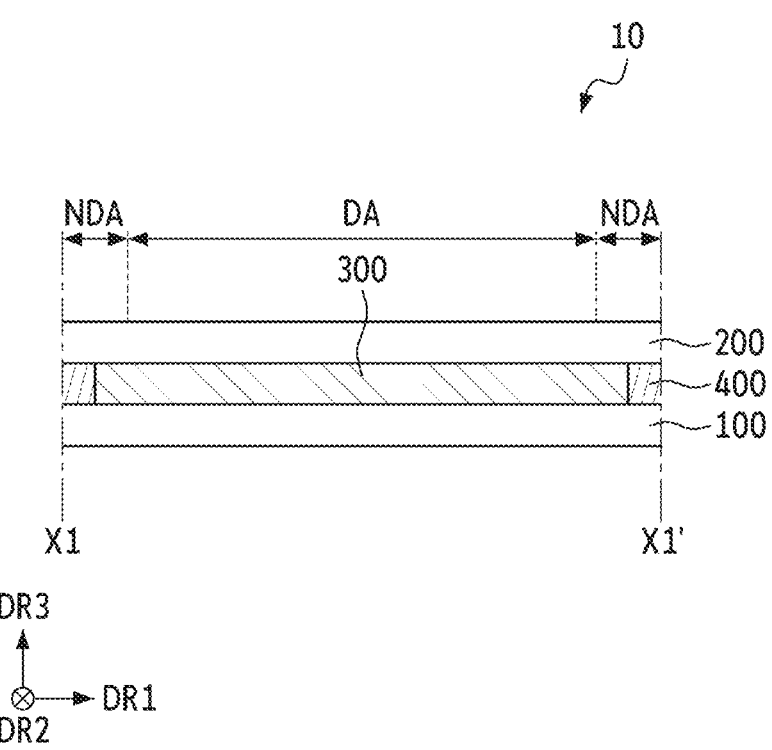
FIG. 2 is a schematic cross-sectional view of the display device taken along line X1-X1' of FIG. 1.

FIG. 1 is a schematic perspective view showing a display device according to an embodiment. FIG. 2 is a schematic cross-sectional view of the display device taken along line X1-X1' of FIG. 1.

Referring to FIGS. 1 and 2, a display device 10 may be applied to a variety of electronic apparatuses, for example, small and medium electronic devices such as a tablet personal computer, a smartphone, a car navigation unit, a camera, a display provided in a vehicle, a wristwatch-type electronic device, a personal digital assistant (PDA), a portable multimedia player (PMP) and a game console, and medium and large electronic devices such as a television, an external billboard, a monitor, a personal computer and a laptop computer. These are suggested as examples, but the display device 10 may also be applied to other electronic devices without departing from the disclosure.

In an embodiment, the display device 10 may have a rectangular shape in plan view. The display device 10 may include two long sides extending in a first direction DR1 and two short sides extending in a second direction DR2 intersecting the first direction DR1. A corner where the long side and the short side of the display device 10 meet may have a right angle. However, the disclosure is not limited thereto, and the corner may have a curved surface. In an embodiment, the long side may extend in the second direction DR2, and the short side may extend in the first direction DR1. The planar shape of the display device 10 is not limited to the described one, but may have a circular shape or other shapes.

In the illustrated figure, the first direction DR1 and the second direction DR2 intersect each other as horizontal directions. For example, the first direction DR1 and the second direction DR2 may be orthogonal to each other. A third direction DR3 intersects the first direction DR1 and the second direction DR2, and may be, for example, perpendicular directions orthogonal to each other. Unless otherwise defined, in the specification, directions indicated by arrows of the first to third directions DR1, DR2, and DR3 may be referred to as one side, and the opposite directions thereto may be referred to as the other side. Also, the terms "above," "upper side," "upper portion," "top," and "top surface," as used herein, refer to a direction indicated by an arrow in the drawing in the third direction DR3 based on the drawings, and the terms "below," "lower side," "lower portion," "bottom," and "bottom surface," as used herein, refer to a direction opposite to the direction indicated by the arrow in the third direction DR3 based on the drawings.

The display device 10 may include a display area DA displaying an image and a non-display area NDA not displaying an image. In an embodiment, the non-display area NDA may be located or disposed around the display area DA and may surround the display area DA (or may be adjacent to the display area DA).

In an embodiment, the display device 10 may include, as a schematic stacked structure, a display substrate 100 and a color conversion substrate 200 facing the display substrate 100, and may further include a sealing portion 400 for coupling or connecting the display substrate 100 and the color conversion substrate 200, and a filler 300 filled between the display substrate 100 and the color conversion substrate 200.

The display substrate 100 may include elements and circuits for displaying an image, for example, a pixel circuit such as a switching element, a pixel defining film and a self-light emitting element that define an emission area and a non-emission area, which will be described later, in the display area DA. In an embodiment, the self-light emitting element may include at least one of an organic light emitting diode, a quantum dot light emitting diode, an inorganic micro light emitting diode (for example, micro LED), or an inorganic nano light emitting diode (for example, nano LED). Hereinafter, for simplicity of description, a case where the self-light emitting element is an organic light emitting element will be described as an example.

The color conversion substrate 200 may be disposed above the display substrate 100, facing the display substrate 100. In an embodiment, the color conversion substrate 200 may include a color conversion pattern for converting the color of incident light. In an embodiment, the color conversion pattern may include at least one of a color filter and a wavelength conversion pattern.

The sealing portion 400 may be positioned between the display substrate 100 and the color conversion substrate 200 in the non-display area NDA. The sealing portion 400 may be disposed along edges of the display substrate 100 and the color conversion substrate 200 in the non-display area NDA to surround the display area DA in plan view. The display substrate 100 and the color conversion substrate 200 may be bonded to each other through the sealing portion 400.

In an embodiment, the sealing portion 400 may be made of an organic material. For example, the sealing portion 400 may be made of an epoxy-based resin, but is not limited thereto.

The filler 300 may be positioned in a space surrounded by the sealing portion 400 between the display substrate 100 and the color conversion substrate 200. The filler 300 may fill the space between the display substrate 100 and the color conversion substrate 200.

In an embodiment, the filler 300 may be made of a material that can transmit light. In an embodiment, the filler 300 may be made of an organic material. For example, the filler 300 may be formed of a silicon-based organic material, an epoxy-based organic material, or the like, but is not limited thereto. In an embodiment, the filler 300 may be omitted.

Figure 3:
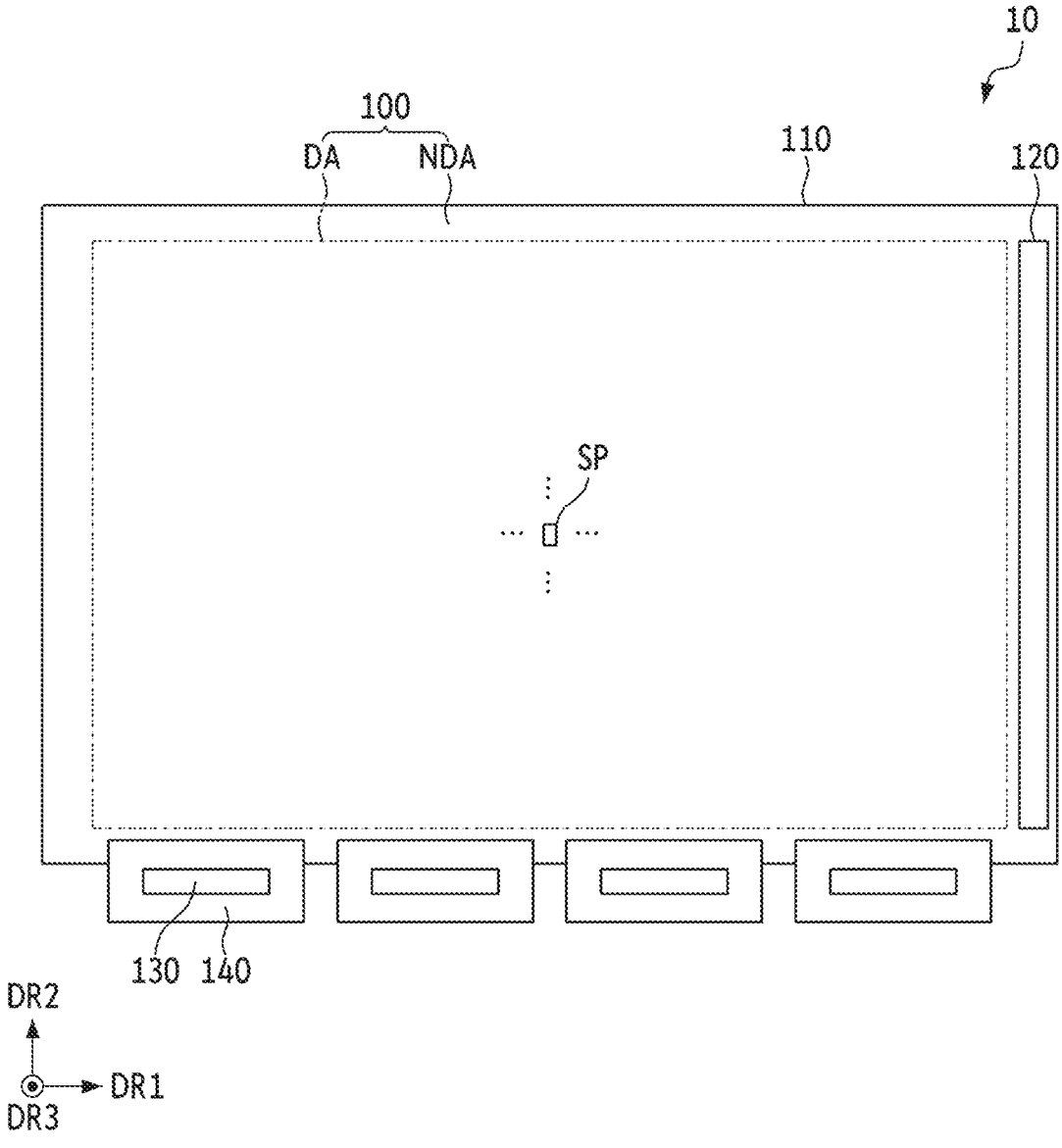
FIG. 3 is a schematic plan view showing a display device according to an embodiment.
Figure 4:
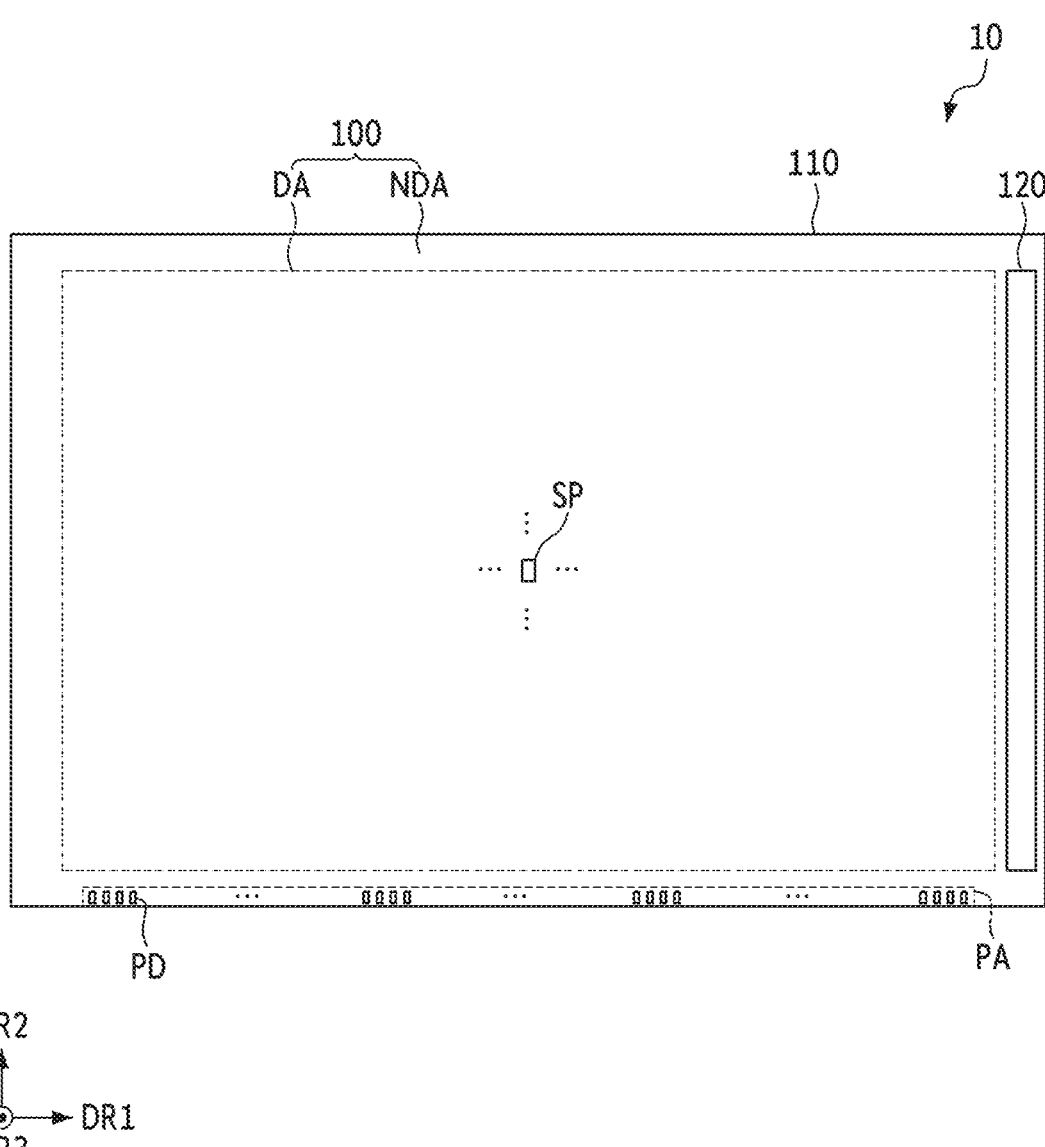
FIG. 4 is a schematic plan view showing a pad area of a display device according to an embodiment.

FIG. 3 is a schematic plan view showing a display device according to an embodiment. FIG. 4 is a schematic plan view showing a pad area of a display device according to an embodiment.

Referring to FIGS. 3 and 4, the display device 10 may include the display substrate 100 including pixels SP, and a first driver 120 and a second driver 130 that supply driving signals to the pixels SP. In an embodiment, the display device 10 may further include a power supply unit for supplying power voltages to the pixels SP, the first driver 120, and the second driver 130, and a timing controller for controlling the operations of the first driver 120 and the second driver 130.

The display substrate 100 may include a display area DA and a non-display area NDA. The display area DA may be an area that displays an image. The display area DA may include the pixel SP. For example, the display area DA may include pixel areas where the pixels SP are disposed. The non-display area NDA is an area other than the display area DA, and an image may not be displayed in the non-display area NDA. In an embodiment, the non-display area NDA may be positioned around the display area DA and may surround the display area DA.

The display substrate 100 may be provided as a rigid panel so as not to be substantially transformed, or as a flexible panel that can be transformed to be at least partially folded, bent, or rolled. The display substrate 100 may be provided to the display device 10 without bending, or may be provided to the display device 10 while being partially bent.

The display substrate 100 may include a first substrate 110, and the pixel SP disposed on the first substrate 110. The pixel SP may be disposed in the display area DA on the first substrate 110.

The first substrate 110, which is a base member for manufacturing or providing the display substrate 100, may form the base surface of the display substrate 100. The first substrate 110 may include the display area DA and the non-display area NDA around the display area DA.

The display area DA may have various shapes depending on embodiments. For example, the display area DA may have a quadrilateral shape, a non-quadrilateral polygonal shape, a circular shape, an elliptical shape, an a typical shape, or another shape. In an embodiment, the display area DA may have a shape conforming to the shape of the display substrate 100.

The pixels SP may be provided and/or arranged or disposed in the display area DA. For example, the display area DA may include pixel areas in which the respective pixels SP are disposed.

In an embodiment, the display device 10 may be a light emitting display device, and each pixel SP may include a light emitting element located or disposed in each emission area and a pixel circuit connected to the light emitting element. In describing embodiments, the term "connect" may include electrical connection and/or physical connection. Each pixel circuit may include transistors (for example, transistors including a driving transistor that generates a driving current corresponding to a data signal, and at least one switching transistor) and at least one capacitor (for example, a capacitor including a storage capacitor).

The non-display area NDA may include a pad area PA where pads PD are disposed. In an embodiment, the non-display area NDA may further include a driving circuit area located or disposed on at least one side or a side of the display area DA. At least one driver, the pads PD, and/or wires may be disposed in the non-display area NDA.

At least one driver for driving the pixel SP, or a part of the driver may be disposed in the driving circuit area. For example, circuit elements constituting the first driver 120 (for example, driver transistors and driver capacitors constituting the stage circuits of the first driver 120) may be disposed in the driving circuit area on the first substrate 110.

In an embodiment, the circuit elements of the first driver 120 may be formed in the display substrate 100 together with the pixel SP. In an embodiment, the driving transistors provided in the first driver 120 may be transistors having a type and/or a structure that may be substantially the same as or similar to those of the transistors provided in the pixel SP, and may be formed simultaneously with the transistors of the pixel SP.

The pads PD may be disposed in the pad area PA. At least one circuit board 140 may be disposed and/or bonded on the pad area PA. In an embodiment, circuit boards 140 connected to different pads PD may be disposed on the pad area PA. The pads PD may include signal pads and power pads for transmitting driving signals and power voltages required for driving the pixels SP and/or the first driver 120 into the display substrate 100.

The first driver 120 and the second driver 130 may generate driving signals for controlling operation timing, luminance, and the like of the pixel SP, and may supply the generated driving signals to the pixel SP. For example, the first driver 120 may be a gate driver including a scan driver, and may be connected to the pixel SP through respective gate lines. The first driver 120 may supply respective gate signals (for example, control signals for controlling the driving timing of the pixels SP, including scan signals and/or emission control signals) to the pixels SP. The second driver 130 may be a data driver including source driving circuits, and may be connected to the pixels SP through respective data lines. The second driver 130 may supply respective data signals to the pixels SP.

In an embodiment, at least one first driver of the first driver 120 or the second driver 130, or a part of the at least one first driver may be embedded in the display substrate 100. For example, the first driver 120 or a part of the first driver 120 may be disposed and/or formed in the non-display area NDA and disposed on the first substrate 110 of the display substrate 100.

Although FIG. 3 illustrates that the first driver 120 is formed on one side or a side of the display area DA (for example, in the non-display area NDA on the right side of the display area DA), but the embodiments are not limited thereto. For example, the first driver 120 may be positioned only on the other side (for example, the non-display area NDA on the left side of the display area DA) of the display area DA, or may be positioned on both sides (for example, the non-display area NDA on the left side and right side of the display area DA) of the display area DA. By way of example, a part of the first driver 120 may be portioned in the non-display area NDA, and another part of the first driver 120 may be positioned in a non-emission area (for example, an area between emission areas of the pixels SP) inside the display area DA.

In an embodiment, the other driver of the first driver 120 and the second driver 130 or a part of the other driver may be disposed or formed outside the display substrate 100 to be electrically connected to the display substrate 100. For example, the second driver 130 may be implemented as a multiple number of integrated circuit chips, which may be disposed on the circuit boards 140 electrically connected to the pixels SP of the display substrate 100. The second driver 130 may be implemented as at least one integrated circuit chip and mounted on the non-display area NDA of the display substrate 100.

The circuit board 140 may be connected to the display substrate 100 through the pads PD. In an embodiment, the circuit board 140 may be a flexible film such as a flexible printed circuit board (FPCB), a printed circuit board (PCB), or a chip on film (COF), but is not limited thereto. In an embodiment, the circuit board 140 may be connected to the timing controller and/or the power supply unit through another circuit board, connector, or the like within the spirit and the scope of the disclosure.

Figure 5:
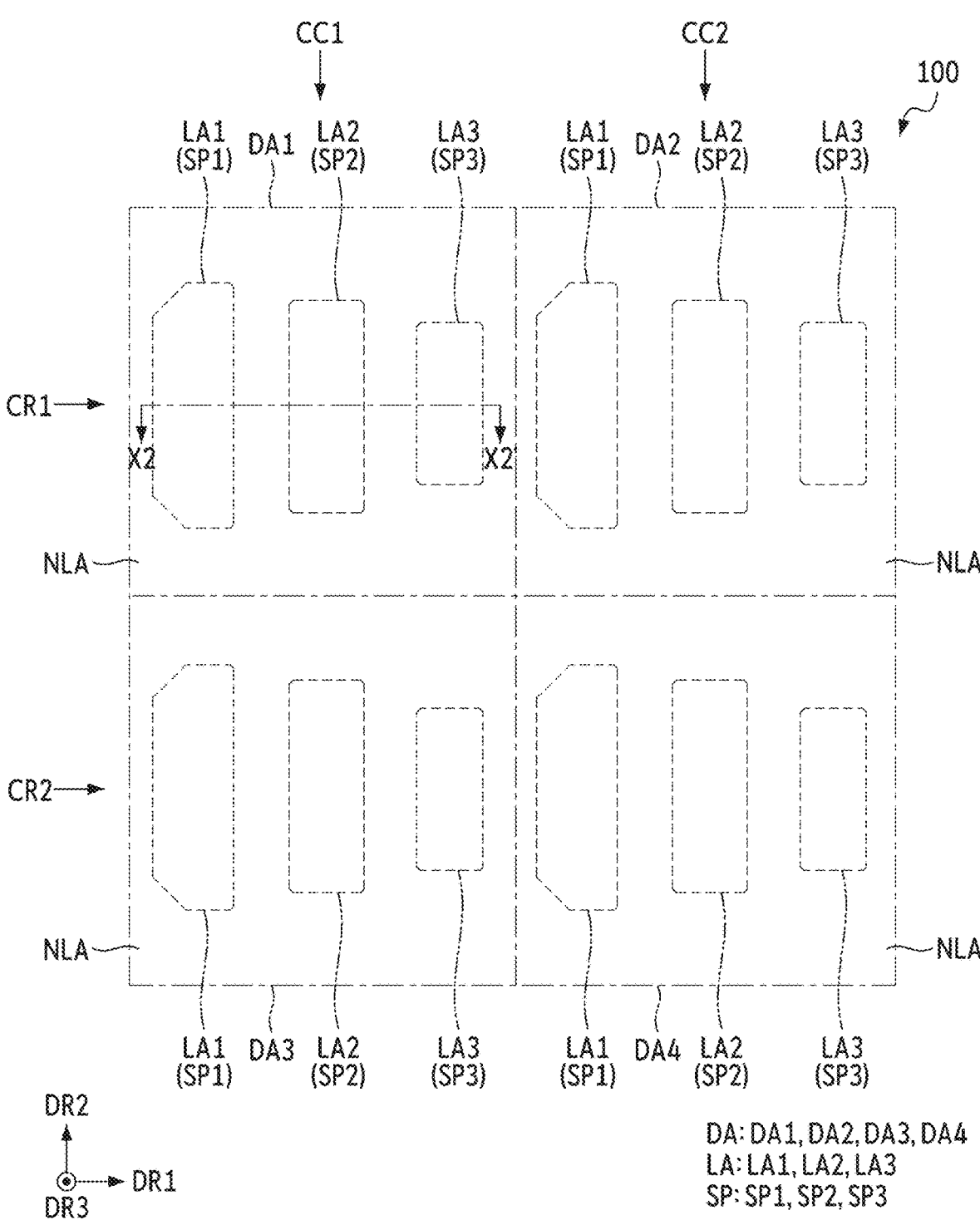
FIG. 5 is a schematic plan view schematically illustrating a part of a display area of a display substrate according to an embodiment.

FIG. 5 is a schematic plan view schematically illustrating a part of a display area of a display substrate according to an embodiment.

Referring to FIG. 5 in addition to FIGS. 1 and 2, emission areas LA and a non-emission area NLA may be defined in the display area DA of the display substrate 100. The emission areas LA may be regions where light generated by the light emitting element ED (see FIG. 7) of the display substrate 100 is emitted to the outside of the display substrate 100, and the non-emission area NLA may be a region where light is not emitted to the outside of the display substrate 100.

In an embodiment, the boundary between the emission area LA and the non-emission area NLA may be defined by an opening of a pixel defining film PDL (see FIG. 6) to be described later and an outer wall surrounding the opening. For example, the emission area LA may be an area that overlaps the opening of the pixel defining film PDL (see FIG. 6), and the non-emission area NLA may be an area that does not overlap the opening of the pixel defining film PDL (see FIG. 6).

The emission areas LA may include a first emission area LA1, a second emission area LA2, and a third emission area LA3.

The light emitted from the display substrate 100 to the color conversion substrate 200 in the emission areas LA may be light of a third color. In an embodiment, the light of the third color may be blue light, and may have a peak wavelength in a range of about 440 nm to about 480 nm. The peak wavelength may refer to a wavelength at which the intensity of light is maximized within a wavelength range. However, the disclosure is not limited thereto, and the light emitted from the display substrate 100 to the color conversion substrate 200 in the emission areas LA may be light in an ultraviolet region.

In case that the first to third emission areas LA1, LA2, and LA3 emit light of the same color, first to third pixels SP1, SP2, and SP3 may express various colors by a color conversion pattern included in the color conversion substrate 200 or the like within the spirit and the scope of the disclosure.

In an embodiment, the first to third emission areas LA1, LA2, and LA3 may emit light of different colors. For example, the color of light emitted from the first emission area LA1 may be red, the color of light emitted from the second emission area LA2 may be green, and the color of light emitted from the third emission area LA3 may be blue.

The first emission area LA1, the second emission area LA2, and the third emission area LA3 may constitute the first pixel SP1, the second pixel SP2, and the third pixel SP3, respectively. The first emission area LA1, the second emission area LA2, and the third emission area LA3 may be repeatedly disposed along the first direction DR1 and the second direction DR2 in the entire display area DA. The first emission area LA1, the second emission area LA2, and the third emission area LA3 may constitute one unit color pixel (or unit pixel).

For example, as shown in FIG. 5, a first display area DA1 located or disposed in a first column CC1 and a first row CR1, a second display area DA2 located or disposed in a second column CC2 and the first row CR1, a third display area DA3 located or disposed in the first column CC1 and a second row CR2, and a fourth display area DA4 located or disposed in the second column CC2 and the second row CR2 may each include the first pixel SP1, the second pixel SP2, and the third pixel SP3. Each of the first to fourth display areas DA1, DA2, DA3, and DA4 may include the first to third emission areas LA1, LA2, and LA3. The first to fourth display areas DA1, DA2, DA3, and DA4 may each constitute one unit color pixel.

In an embodiment, the first to third emission areas LA1, LA2, and LA3 may be disposed along the first direction DR1. For example, in one unit color pixel, the first emission area LA1 may be disposed substantially at the left side in plan view, the second emission area LA2 may be disposed substantially at the center in plan view, and the third emission area LA3 may be disposed substantially at the right side in plan view. However, the disposition of the first to third emission areas LA1, LA2, and LA3 is not limited thereto.

In an embodiment, the first to third emission areas LA1, LA2, and LA3 may have a polygonal shape extending in the second direction DR2. In the drawing, a case where the first emission area LA1 has a hexagonal shape, and the second emission area LA2 and the third emission area LA3 have a quadrilateral shape is illustrated as an example. However, the shape of the first to third emission areas LA1, LA2, and LA3 is not limited thereto.

In an embodiment, the widths and shapes of the first to third emission areas LA1, LA2, and LA3 may be different from each other. For example, in the first direction DR1, the width of the first emission area LA1 may be larger than the width of the second emission area LA2, and the width of the second emission area LA2 may be larger than the width of the third emission area LA3. As another example, in the second direction DR2, the width of the first emission area LA1 may be larger than the width of the second emission area LA2, and the width of the second emission area LA2 may be larger than the width of the third emission area LA3. However, the width and shape of the first to third emission areas LA1, LA2, and LA3 are not limited thereto. For example, the first to third emission areas LA1, LA2, and LA3 may have the same width and the same shape.

The non-emission area NLA may be positioned around the emission area LA of the display substrate 100 in the display area DA. The non-emission area NLA may be positioned not only around the emission area LA, but also between the first emission area LA1 and the second emission area LA2, between the second emission area LA2 and the third emission area LA3, and between the third emission area LA3 and the first emission area LA1.

The light emitted from the emission area LA of the display substrate 100 may be provided to the outside of the display device 10 while passing through the light transmitting area of the color conversion substrate 200.

Figure 6:
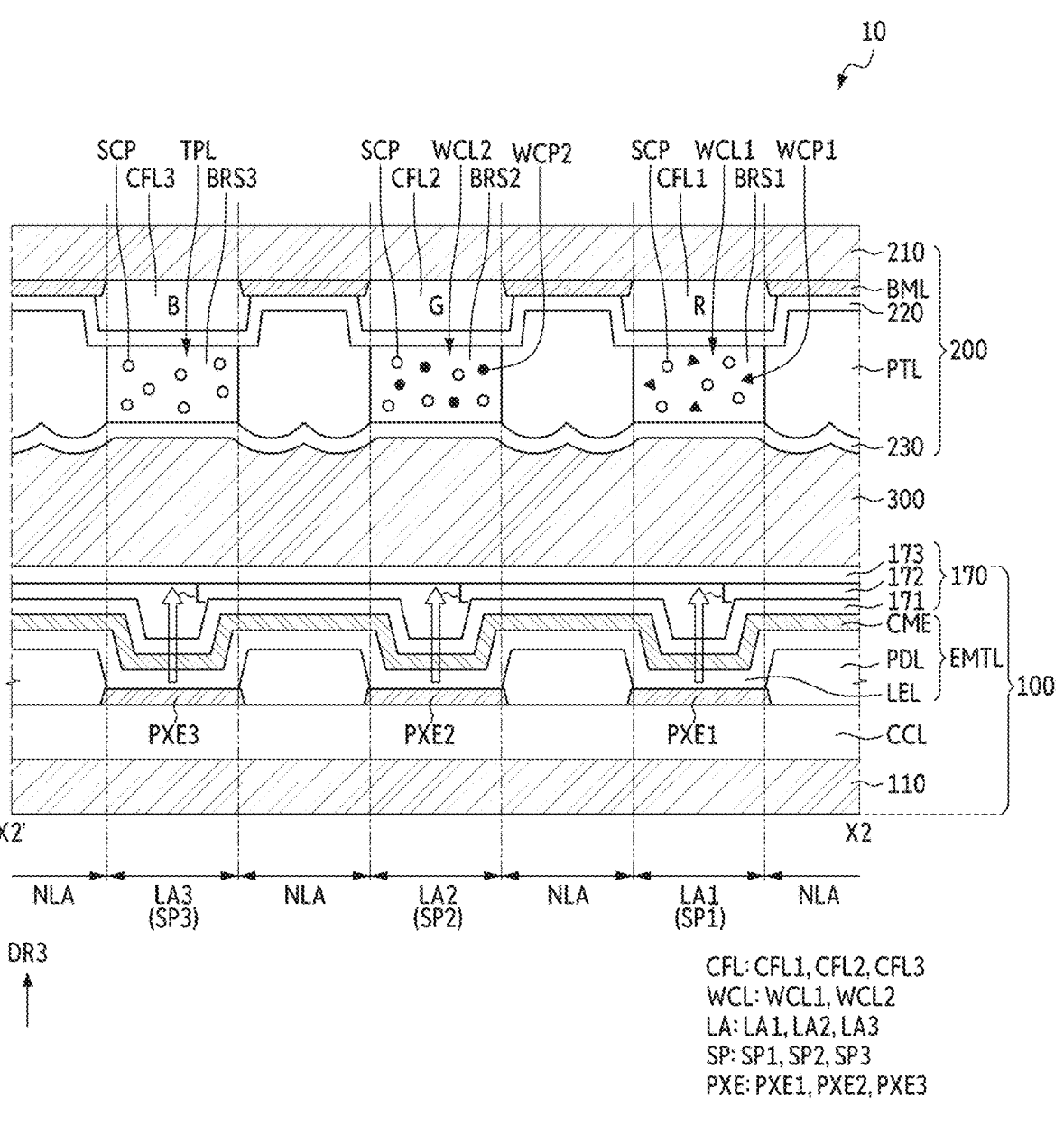
FIG. 6 is a schematic cross-sectional view of the display device taken along line X2-X2' of FIG. 5.

FIG. 6 is a schematic cross-sectional view of the display device taken along line X2-X2' of FIG. 5.

Referring to FIG. 6 in addition to FIG. 5, the display device 10 may include the display substrate 100, the color conversion substrate 200 facing the display substrate 100, and the filler 300 for bonding them.

The display substrate 100 may include the first substrate 110, a circuit layer CCL, a light emitting element layer EMTL, and an encapsulation structure 170.

The first substrate 110 may include a transparent material. For example, the first substrate 110 may include a transparent insulating material such as glass, quartz, or the like within the spirit and the scope of the disclosure. The first substrate 110 may be a rigid substrate. However, the first substrate 110 is not limited thereto, and may include plastic such as polyimide or the like, and may have a flexible property such that it can be twisted, bent, folded, or rolled.

The circuit layer CCL (for example, a thin film transistor layer) may be disposed on the first substrate 110. A description of the circuit layer CCL will be described later with reference to FIG. 8 and the like within the spirit and the scope of the disclosure.

The light emitting element layer EMTL may be disposed on the circuit layer CCL. The light emitting element layer EMTL may include a pixel electrode PXE, the pixel defining film PDL, a light emitting layer LEL, and a common electrode CME.

The pixel electrode PXE may be a first electrode (for example, an anode electrode) of a light emitting diode. The pixel electrode PXE may have a stacked structure formed by stacking a material layer having a high work function, such as indium tin oxide (ITO), indium zinc oxide (IZO), zinc oxide (ZnO) and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof. The material layer having a high work function may be disposed above the reflective material layer and disposed closer to the light emitting layer LEL. The pixel electrode PXE may have a multilayer structure such as ITO/Mg, ITO/MgF, ITO/Ag and ITO/Ag/ITO, but is not limited thereto.

The pixel electrode PXE may include the first pixel electrode PXE1, the second pixel electrode PXE2, and the third pixel electrode PXE3. The first pixel electrode PXE1 may be disposed to overlap the first emission area LA1. The second pixel electrode PXE2 may be disposed to overlap the second emission area LA2. The third pixel electrode PXE3 may be disposed to overlap the third emission area LA3.

The pixel defining film PDL may be disposed along the boundary of the pixel SP on one surface or a surface of the first substrate 110. The pixel defining film PDL may be disposed on the pixel electrode PXE and may include an opening to expose the pixel electrode PXE. The emission area LA and the non-emission area NLA may be distinguished by the pixel defining film PDL and the opening thereof.

The pixel defining film PDL may include an organic insulating material such as acrylic resin, epoxy resin, phenolic resin, polyamide resin, polyimide resin, unsaturated polyester resin, polyphenylene resin, polyphenylenesulfide resin or benzocyclobutene (BCB). The pixel defining film PDL may include an inorganic material.

The light emitting layer LEL may be disposed on the pixel electrode PXE exposed by the pixel defining film PDL. The light emitting layer LEL may be in contact with not only the pixel electrode PXE, but also the side surface and the top surface of the pixel defining film PDL. The light emitting layer LEL may be connected across the emission area LA and the pixel SP. The light emitting layer LEL may be disposed across the emission area LA and the pixel SP. Accordingly, the wavelength of light emitted from the light emitting layer LEL may be the same for each of the emission areas LA1, LA2, and LA3. For example, the light emitting layer LEL of each of the emission areas LA1, LA2, and LA3 may emit blue light or ultraviolet rays, and the color conversion substrate 200 which will be described later may include a wavelength conversion layer WCL, thereby displaying a color for each pixel SP.

In an embodiment, the light emitting layers LEL may be spaced apart from each other for each of the emission areas LA1, LA2, and LA3 distinguished by the pixel defining film PDL. For example, the wavelength of light emitted from each light emitting layer LEL may be different for each of the emission areas LA1, LA2, and LA3. For example, the wavelengths of lights emitted from the first emission area LA1, the second emission area LA2, and the third emission area LA3 may be different from each other.

In an embodiment in which the display device 10 is an organic light emitting display, the light emitting layer LEL may include an organic layer containing an organic material. The organic layer may have an organic light emitting layer, and in some cases, may further have at least one of a hole injection layer, a hole transport layer, an electron transport layer, or an electron injection layer as an auxiliary layer for light emission. In an embodiment, in case that the display device 10 is a micro LED display, a nano LED display or the like, the light emitting layer LEL may include an inorganic material such as an inorganic semiconductor.

In an embodiment, the light emitting layer LEL may have a tandem structure in which organic light emitting layers are superposed in the thickness direction and a charge generation layer is disposed between the organic light emitting layers. The respective organic light emitting layers superposed may emit light of the same wavelength, or may emit light of different wavelengths. At least some of the light emitting layers LEL of each pixel SP may be separated from or connected to the same layer of the neighboring pixel SP by the pixel defining film PDL.

The common electrode CME may be arranged or disposed on the light emitting layer LEL. The common electrode CME may be connected across the emission area LA and the pixel SP. The common electrode CME may be a full surface electrode disposed across the emission area LA and the pixel SP. The common electrode CME may be a second electrode (for example, a cathode electrode) of a light emitting diode. The common electrode CME may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (for example, a mixture of Ag and Mg). The common electrode CME may further include a transparent metal oxide layer disposed on the material layer having a low work function.

The pixel electrode PXE, the light emitting layer LEL, and the common electrode CME may constitute the light emitting element ED (see FIG. 7) (for example, an OLED). Light emitted from the light emitting layer LEL may be emitted upward through the common electrode CME.

The encapsulation structure 170 may be disposed on the common electrode CME. The encapsulation structure 170 may include at least a thin film encapsulation layer. For example, the encapsulation structure 170 may include a first encapsulation inorganic film 171, an encapsulation organic film 172, and a second encapsulation inorganic film 173.

The first encapsulation inorganic film 171 may be disposed on the light emitting element layer EMTL. The first encapsulation inorganic film 171 may include silicon nitride ($SiN_x$), silicon oxide ($SiO_x$), silicon oxynitride ($SiO_xN_y$), or the like within the spirit and the scope of the disclosure.

The encapsulation organic film 172 may be disposed on the first encapsulation inorganic film 171. The encapsulation organic film 172 may include an organic insulating material selected from the group consisting of acrylic resin, epoxy resin, phenolic resin, polyamide resin, polyimide resin, unsaturated polyester resin, polyphenylene ether resin, polyphenylenesulfide resin and benzocyclobutene (BCB).

The second encapsulation inorganic film 173 may be disposed on the encapsulation organic film 172. The second encapsulation inorganic film 173 may include the same material as the first encapsulation inorganic film 171 described above. For example, the second encapsulation inorganic film 173 may include silicon nitride ($SiN_x$), silicon oxide ($SiO_x$), silicon oxynitride ($SiO_xN_y$), or the like within the spirit and the scope of the disclosure.

In an embodiment, some layers of the encapsulation structure 170 or the entire encapsulation structure 170 may be omitted. In case that the encapsulation structure 170 may be omitted, the filler 300, the sealing portion 400, and the color conversion substrate 200 may be directly disposed on the light emitting element layer EMTL, and the filler 300, the sealing portion 400, and the color conversion substrate 200 may directly perform an encapsulation function.

The color conversion substrate 200 may be disposed to face the display substrate 100 on the encapsulation structure 170. The color conversion substrate 200 may include a second substrate 210, a light blocking member BML, a color filter layer CFL, a first capping layer 220, a partition wall PTL, a wavelength conversion layer WCL, a light transmitting layer TPL, and a second capping layer 230.

The second substrate 210 may include a transparent material. The second substrate 210 may include a transparent insulating material such as glass, quartz, or the like within the spirit and the scope of the disclosure. The second substrate 210 may be a rigid substrate. However, the second substrate 210 is not limited thereto. The second substrate 210 may include plastic such as polyimide or the like, and may have a flexible property such that it can be twisted, bent, folded, or rolled.

The second substrate 210 may be the same substrate as the first substrate 110, but may have a different material, thickness, transmittance and the like within the spirit and the scope of the disclosure. For example, the second substrate 210 may have a higher transmittance than the first substrate 110. The second substrate 210 may be thicker or thinner than the first substrate 110.

The light blocking member BML may be disposed along the boundary of the pixel SP on one surface or a surface of the second substrate 210 that faces the first substrate 110. The light blocking member BML may overlap the pixel defining film PDL of the display substrate 100 and may be positioned in the non-emission areas NLA. The light blocking member BML may include openings to expose the surface of the second substrate 210 overlapping the emission areas LA. The light blocking member BML may be formed in a grid shape in plan view.

The light blocking member BML may include an organic material. The light blocking member BML may reduce color distortion due to external light reflection by absorbing the external light. Further, the light blocking member BML may serve to prevent light which is emitted from the light emitting layer LEL from entering the adjacent pixels SP.

In an embodiment, the light blocking member BML may absorb all visible wavelengths. The light blocking member BML may include a light absorbing material. For example, the light blocking member BML may be formed of a material used as a black matrix of the display device 10.

In an embodiment, the light blocking member BML may absorb light of given wavelengths among visible wavelengths and transmit light of other wavelengths. For example, the light blocking member BML may include a same material as the color filter layer CFL. For example, the light blocking member BML may be made of a same material as a blue color filter layer. In an embodiment, the light blocking member BML may be integral with the blue color filter layer. By way of example, the light blocking member BML may be omitted.

The color filter layer CFL may be disposed on one surface or a surface of the second substrate 210 on which the light blocking member BML is disposed. The color filter layer CFL may be provided on the surface of the second substrate 210 which is exposed through the opening of the light blocking member BML. Further, each color filter layer CFL may be partially disposed on the adjacent light blocking member BML.

The color filter layer CFL may include a first color filter layer CFL1 disposed in the first pixel SP1, a second color filter layer CFL2 disposed in the second pixel SP2, and a third color filter layer CFL3 disposed in the third pixel SP3. Each of the color filter layers CFL may include a colorant such as a dye or a pigment that absorbs wavelengths other than the corresponding color wavelength. The first color filter layer CFL1 may be a red color filter layer, the second color filter layer CFL2 may be a green color filter layer, and the third color filter layer CFL3 may be a blue color filter layer. In the drawing, neighboring color filter layers CFL are disposed to be spaced apart from each other on the light blocking member BML, but the neighboring color filter layers CFL may partially overlap each other on the light blocking member BML.

The first capping layer 220 may be disposed on the color filter layer CFL. The first capping layer 220 may prevent impurities such as moisture or air from permeating from the outside and damaging or contaminating the color filter layers CFL. Further, the first capping layer 220 may prevent the colorant of the color filter layer CFL from being diffused into other components.

The first capping layer 220 may be in direct contact with one surface or a surface (for example, the bottom surface in FIG. 6) of the color filter layer CFL. The first capping layer 220 may be made of an inorganic material. For example, the first capping layer 220 may include silicon nitride, aluminum nitride, zirconium nitride, titanium nitride, hafnium nitride, tantalum nitride, silicon oxide, aluminum oxide, titanium oxide, tin oxide, silicon oxynitride, or the like within the spirit and the scope of the disclosure.

The partition wall PTL may be disposed on the first capping layer 220. The partition wall PTL may be positioned in the non-emission area NLA. The partition wall PTL may be disposed to overlap the light blocking member BML. The partition wall PTL may include an opening exposing the color filter layer CFL. The partition wall PTL may include a photosensitive organic material, but the disclosure is not limited thereto. The partition wall PTL may further include a light blocking material.

The wavelength conversion layer WCL and/or the light transmitting layer TPL may be disposed in the space exposed by the opening of the partition wall PTL. The wavelength conversion layer WCL and the light transmitting layer TPL may be formed by an inkjet process using the partition wall PTL as a bank, but the disclosure is not limited thereto.

In an embodiment in which the light emitting layer LEL of each pixel SP emits light in a third color, the wavelength conversion layer WCL may include a first wavelength conversion pattern WCL1 disposed in the first pixel SP1 and a second wavelength conversion pattern WCL2 disposed in the second pixel SP2. The light transmitting layer TPL may be disposed in the third pixel SP3.

The first wavelength conversion pattern WCL1 may include a first base resin BRS1 and a first wavelength conversion material WCP1 provided in the first base resin BRS1. The second wavelength conversion pattern WCL2 may include a second base resin BRS2 and a second wavelength conversion material WCP2 provided in the second base resin BRS2. The light transmitting layer TPL may include a third base resin BRS3 and a scatterer SCP provided in the third base resin BRS3.

The first to third base resins BRS1, BRS2, and BRS3 may include a light transmitting organic material. For example, the first to third base resins BRS1, BRS2, and BRS3 may include an epoxy resin, an acrylic resin, a cardo resin, an imide resin, or the like within the spirit and the scope of the disclosure. The first to third base resins BRS1, BRS2 and BRS3 may be formed of a same material, but the disclosure is not limited thereto.

The scatterer SCP may be a metal oxide particle or an organic particle. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like within the spirit and the scope of the disclosure. Examples of a material of the organic particles may include acrylic resin and urethane resin, and the like within the spirit and the scope of the disclosure.

The first wavelength conversion material WCP1 may convert the third color into the first color, and the second wavelength conversion material WCP2 may convert the third color into the second color. The first wavelength conversion material WCP1 and the second wavelength conversion material WCP2 may be quantum dots, quantum bars, phosphors or the like within the spirit and the scope of the disclosure. Examples of the quantum dot may include group IV nanocrystal, group II-VI compound nanocrystal, group III-V compound nanocrystal, group IV-VI nanocrystal, and a combination thereof. The first wavelength conversion pattern WCL1 and the second wavelength conversion pattern WCL2 may further include the scatterer SCP for increasing wavelength conversion efficiency.

The light transmitting layer TPL disposed in the third pixel SP3 may transmit light of a third color emitted from the light emitting layer LEL while maintaining the wavelength thereof. The scatterer SCP of the light transmitting layer TPL may serve to control an emission path of the light emitted through the light transmitting layer TPL. The light transmitting layer TPL may not include a wavelength conversion material.

The second capping layer 230 may be disposed on the wavelength conversion layer WCL, the light transmitting layer TPL, and the partition wall PTL. The second capping layer 230 may be formed of an inorganic material. The second capping layer 230 may include a material selected from the above-mentioned materials of the first capping layer 220. The first capping layer 220 and the second capping layer 230 may be formed of a same material, but the disclosure is not limited thereto.

The filler 300 may be disposed between the display substrate 100 and the color conversion substrate 200. The filler 300 may fill a space between the display substrate 100 and the color conversion substrate 200, and may serve to bond them to each other. The filler 300 may be disposed between the encapsulation structure 170 of the display substrate 100 and the second capping layer 230 of the color conversion substrate 200. The filler 300 may be formed of a Si-based organic material, an epoxy-based organic material, or the like, but is not limited thereto.

Figure 7:
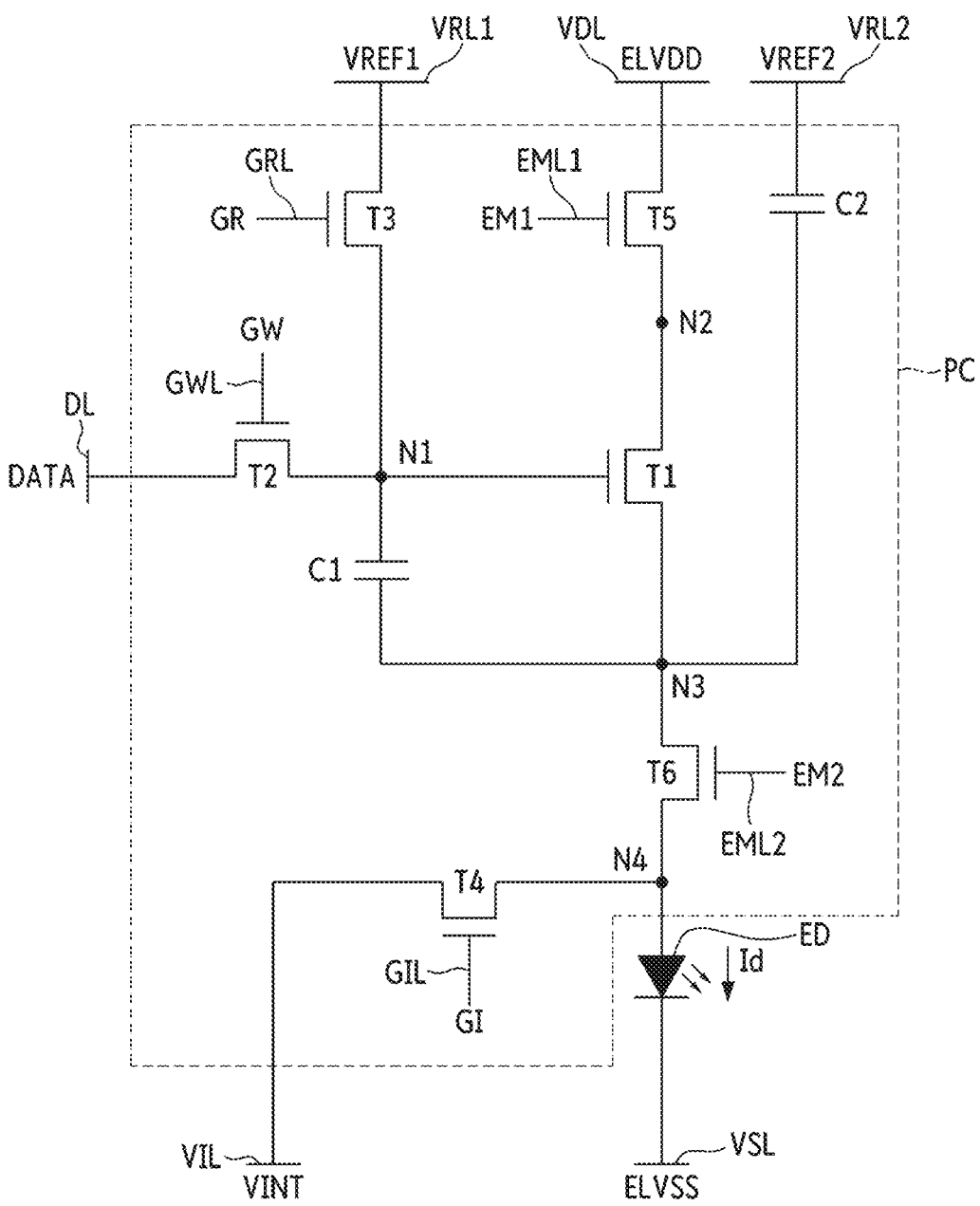
FIG. 7 is a schematic diagram of an equivalent circuit of a pixel of a display substrate according to an embodiment.

FIG. 7 is a schematic diagram of an equivalent circuit of a pixel of a display substrate according to an embodiment.

Referring to FIG. 7 in addition to FIGS. 3 and 4, the pixel SP may include the light emitting element ED, and a pixel circuit PC connected to the light emitting element ED. The light emitting element ED is a light source of the pixel SP, and it may be, for example, an organic light emitting diode, but is not limited thereto. The pixel circuit PC may control the emission timing and the luminance of the light emitting element ED.

The pixel circuit PC may include transistors T and at least one capacitor C. For example, the pixel circuit PC may include first to sixth transistors T1 to T6, a first capacitor C1, and a second capacitor C2. Although FIG. 7 shows an embodiment in which all the first to sixth transistors T1 to T6 are N-type transistors, the types of the transistors T are not limited thereto. For example, at least one of the transistors T may be a P-type transistor.

The pixel circuit PC may supply a driving current Id to the light emitting element ED in response to the driving signals supplied from the first driver 120 and the second driver 130. For example, the pixel circuit PC may supply the driving current Id to the light emitting element ED in response to respective gate signals GS supplied from the first driver 120 through respective gate lines GL and a data signal DATA supplied from the second driver 130 through a data line DL.

The first transistor T1 may be a driving transistor of the pixel SP whose magnitude of drain-source current (for example, the driving current Id) is determined depending on the gate-source voltage. The second to sixth transistors T2 to T6 may be switching transistors that are turned on or turned off depending on respective gate-source voltages. Depending on the type (for example, P-type or N-type) and/or operating conditions of each of the first to sixth transistors T1 to T6, a first electrode of each of the first to sixth transistors T1 to T6 may be a drain electrode (or a drain region), or a source electrode (or a source region), and a second electrode thereof may be an electrode different from the first electrode. For example, in case that the first electrode is a drain electrode, the second electrode may be a source electrode.

The pixel SP may be connected to a first gate line GWL that transmits a first gate signal GW (for example, a scan signal), a second gate line GIL that transmits a second gate signal GI, a third gate line GRL that transmits a third gate signal GR, a first emission control line EML1 that transmits a first emission control signal EM1, a second emission control line EML2 that transmits a second emission control signal EM2, and the data line DL that transmits the data signal DATA. Further, the pixel SP may be connected to a first driving power line VDL that transmits a first pixel voltage ELVDD (or a first pixel power voltage), and a second driving power line VSL that transmits a second pixel voltage ELVSS (or a second pixel power voltage). In an embodiment, the pixel SP may be further connected to an initialization power line VIL that transmits an initialization voltage VINT (or a third pixel power voltage), a first reference power line VRL1 that transmits a first reference voltage VREF1 (or a fourth pixel power voltage), and a second reference power line VRL2 that transmits a second reference voltage VREF2 (or a fifth pixel power voltage). In an embodiment, the first driving power line VDL, the second driving power line VSL, the initialization power line VIL, the first reference power line VRL1, and the second reference power line VRL2 may be included in a power line.

In an embodiment, the first to sixth transistors T1 to T6 may be oxide transistors including an oxide semiconductor. By way of example, an active layer of each of the first to sixth transistors T1 to T6 may include the oxide semiconductor. However, the embodiments are not limited thereto. For example, at least one of the transistors T may include a semiconductor material (for example, amorphous silicon or polysilicon) other than an oxide semiconductor.

The oxide semiconductor may have high carrier mobility and a low leakage current, so that a considerable voltage drop may not occur even if the driving time of the oxide transistor increases. For example, the pixel SP including an oxide transistor may be driven at a low frequency because the change in the luminance and/or the color of an image due to a voltage drop is not significant even in case that it is driven at a low frequency. In case that the first to sixth transistors T1 to T6 are formed of oxide transistors, the leakage current of the pixel SP may be reduced or prevented and the power consumption may be reduced.

The first transistor T1 may include a first gate electrode connected to a first node N1, a first electrode (for example, a first drain electrode) connected to a second node N2, and a second electrode (for example, a first source electrode) connected to a third node N3. The first electrode of the first transistor T1 may be connected to the first driving power line VDL via the fifth transistor T5, and the second electrode thereof may be connected to the light emitting element ED via the sixth transistor T6. The first transistor T1 may control the magnitude (for example, current amount) of the driving current Id flowing to the light emitting element ED to correspond to the data signal DATA transmitted through the first node N1.

The second transistor T2 may include a second gate electrode connected to the first gate line GWL, a first electrode (for example, a second drain electrode) connected to the data line DL, and a second electrode (for example, a second source electrode) connected to the first node N1. The second transistor T2 may be turned on by the first gate signal GW (for example, the first gate signal GW of the gate-on voltage) transmitted through the first gate line GWL to connect the data line DL and the first node N1. Accordingly, the data signal DATA transmitted through the data line DL may be sent to the first node N1.

The third transistor T3 may include a third gate electrode connected to the third gate line GRL, a first electrode (for example, a third source electrode) connected to the first reference power line VRL1, and a second electrode (for example, a third drain electrode) connected to the first node N1. The third transistor T3 may be turned on by the third gate signal GR transmitted through the third gate line GRL and transmit the first reference voltage VREF1 transmitted through the first reference power line VRL1 to the first node N1.

The fourth transistor T4 may include a fourth gate electrode connected to the second gate line GIL, a first electrode (for example, a fourth drain electrode) connected to a fourth node N4, and a second electrode (for example, a fourth source electrode) connected to the initialization power line VIL. The fourth transistor T4 may be turned on by the second gate signal GI transmitted through the second gate line GIL and transmit the initialization voltage VINT transmitted through the initialization power line VIL to the fourth node N4.

The fifth transistor T5 may include a fifth gate electrode connected to the first emission control line EML1, a first electrode (for example, a fifth drain electrode) connected to the first driving power line VDL, and a second electrode (for example, a fifth source electrode) connected to the second node N2 (or the first electrode of the first transistor T1). The fifth transistor T5 may be turned on by the first emission control signal EM1 (for example, the first emission control signal EM1 of the gate-on voltage) transmitted through the first emission control line EML1, thereby controlling the emission timing of the pixel SP.

The sixth transistor T6 may include a sixth gate electrode connected to the second emission control line EML2, a first electrode (for example, a sixth drain electrode) connected to the third node N3 (or the second electrode of the first transistor T1), and a second electrode (for example, the fifth source electrode) connected to the fourth node N4. The sixth transistor T6 may be turned on by the second emission control signal EM2 (for example, the second emission control signal EM2 of the gate-on voltage) transmitted through the second emission control line EML2, thereby controlling the emission timing of the pixel SP.

The first capacitor C1 may be connected between the first node N1 and the third node N3. The first capacitor C1 is a storage capacitor of the pixel SP, and may store therein a threshold voltage of the first transistor T1 and a voltage corresponding to the data signal DATA (for example, a data voltage).

The second capacitor C2 may be connected between the second reference power line VRL2 and the third node N3 (for example, the second electrode of the first transistor T1). In an embodiment, the capacitance of the second capacitor C2 may be less than that of the first capacitor C1.

The light emitting element ED may be connected between the fourth node N4 and the second driving power line VSL. For example, the light emitting element ED may include a first electrode (for example, an anode electrode or a pixel electrode) connected to the fourth node N4, a second electrode (for example, a cathode electrode or a common electrode) facing the first electrode and connected to the second driving power line VSL, and a light emitting layer disposed between the first electrode and the second electrode. In an embodiment, the first electrode of the light emitting element ED may be an individual electrode individually provided in each pixel SP, and the second electrode of the light emitting element ED may be a common electrode shared by the pixels SP. The light emitting element ED may emit light with a luminance corresponding to the driving current Id during a time period in which the driving current Id is supplied from the pixel circuit PC.

Figure 8:
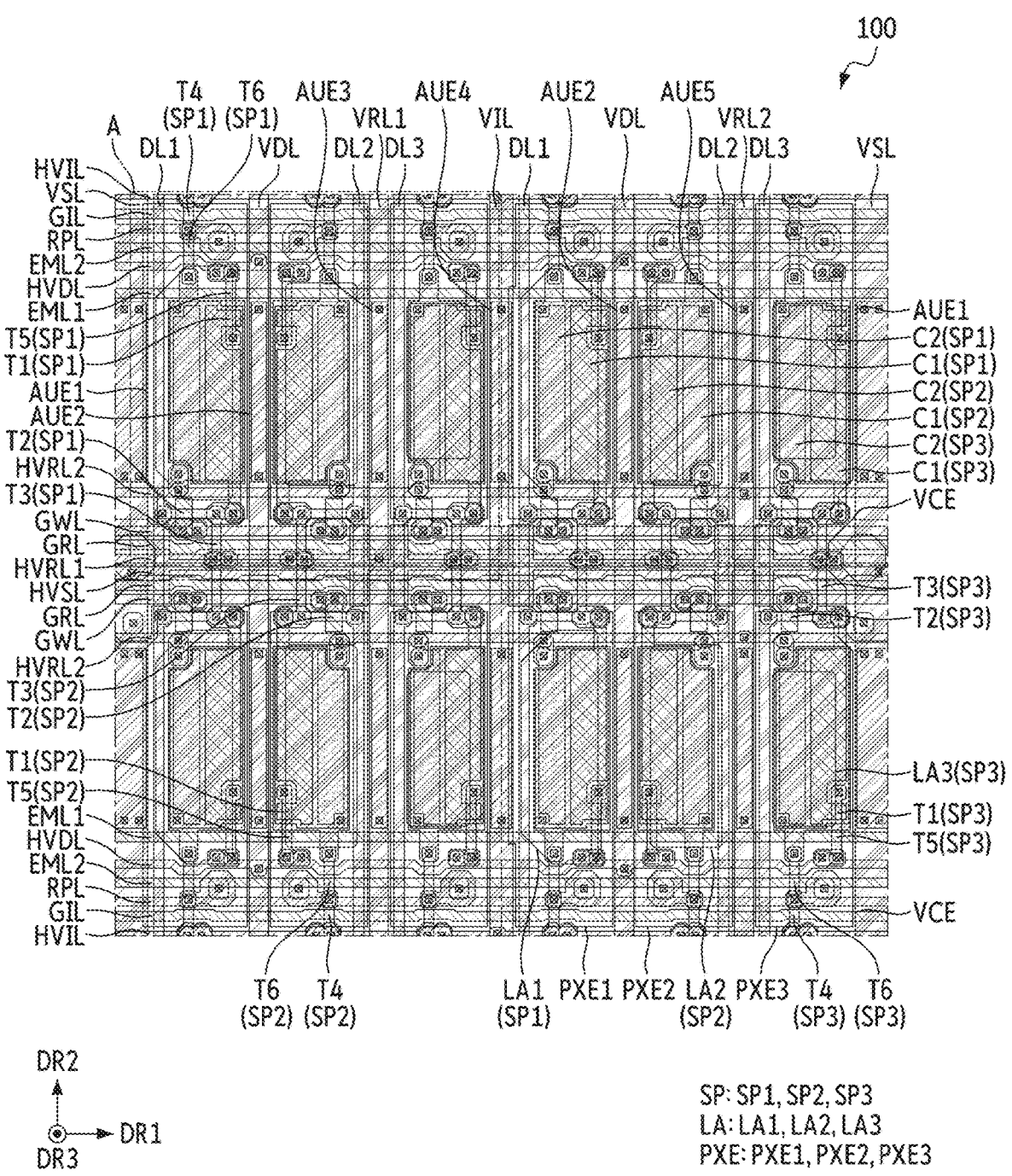
FIG. 8 is a plan diagram illustrating wires of a display substrate according to an embodiment.
Figure 9:
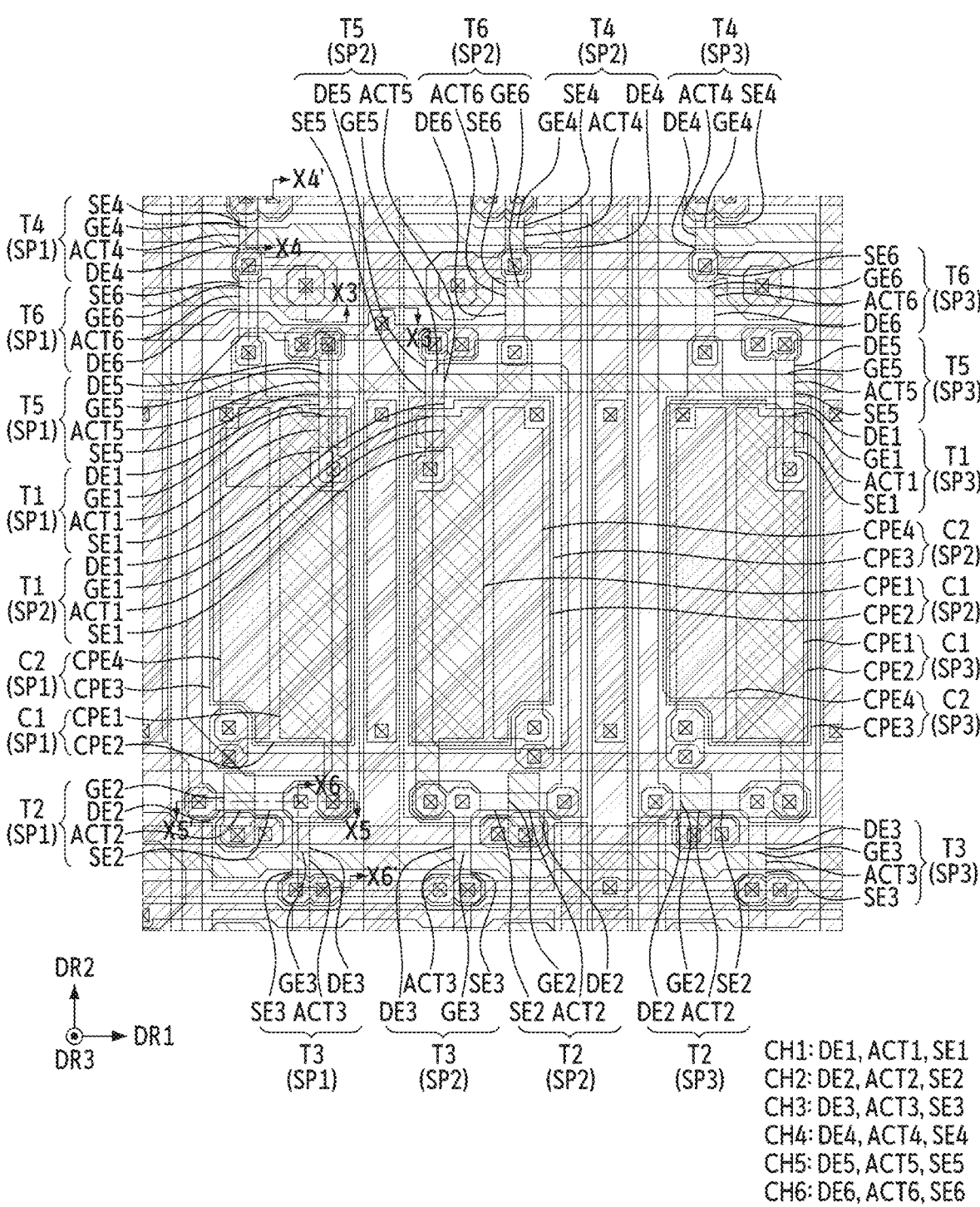
FIG. 9 is an enlarged view of area A of FIG. 8.
Figure 10:
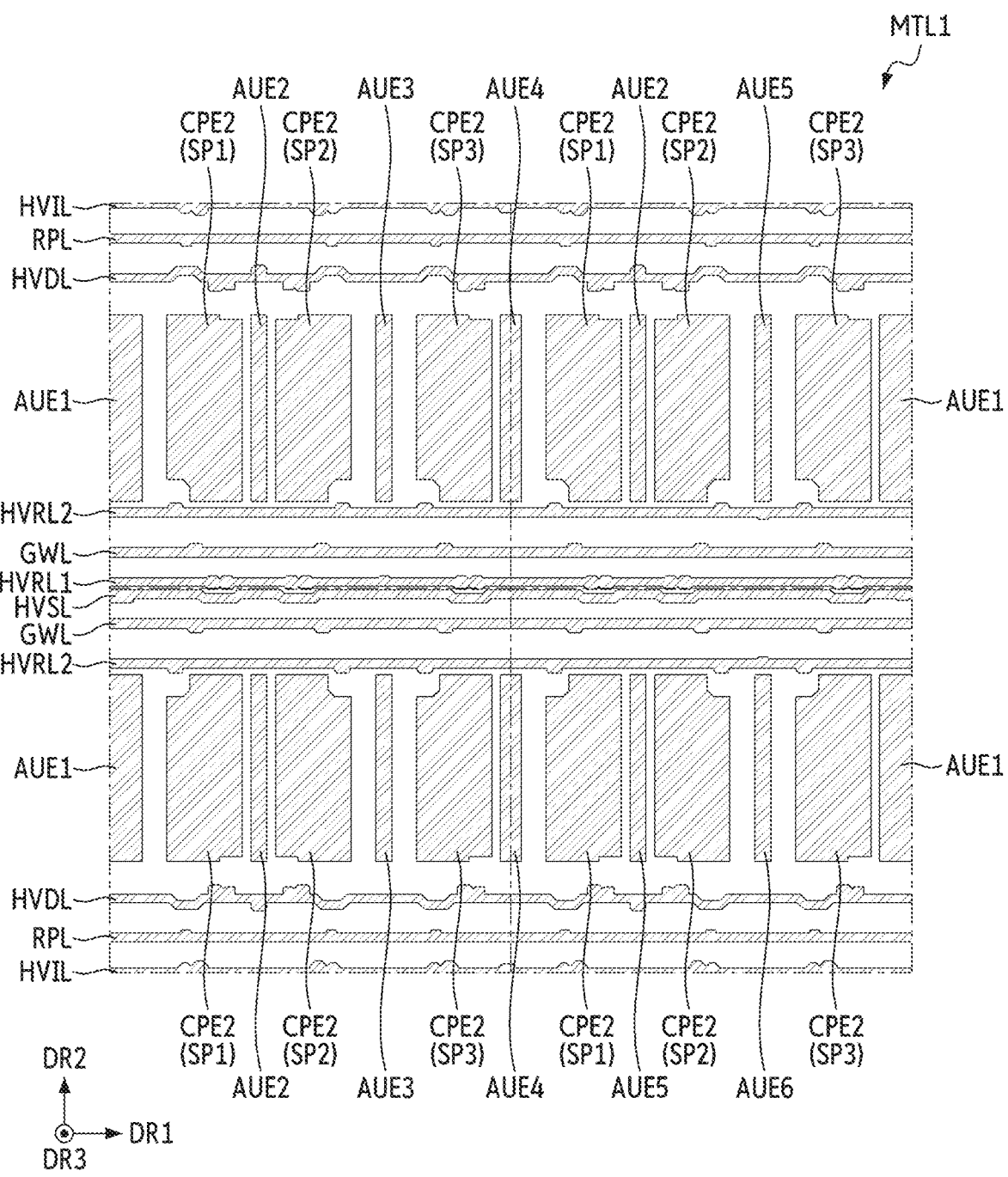
FIG. 10 is a plan diagram showing a first conductive layer according to an embodiment.
Figure 11:
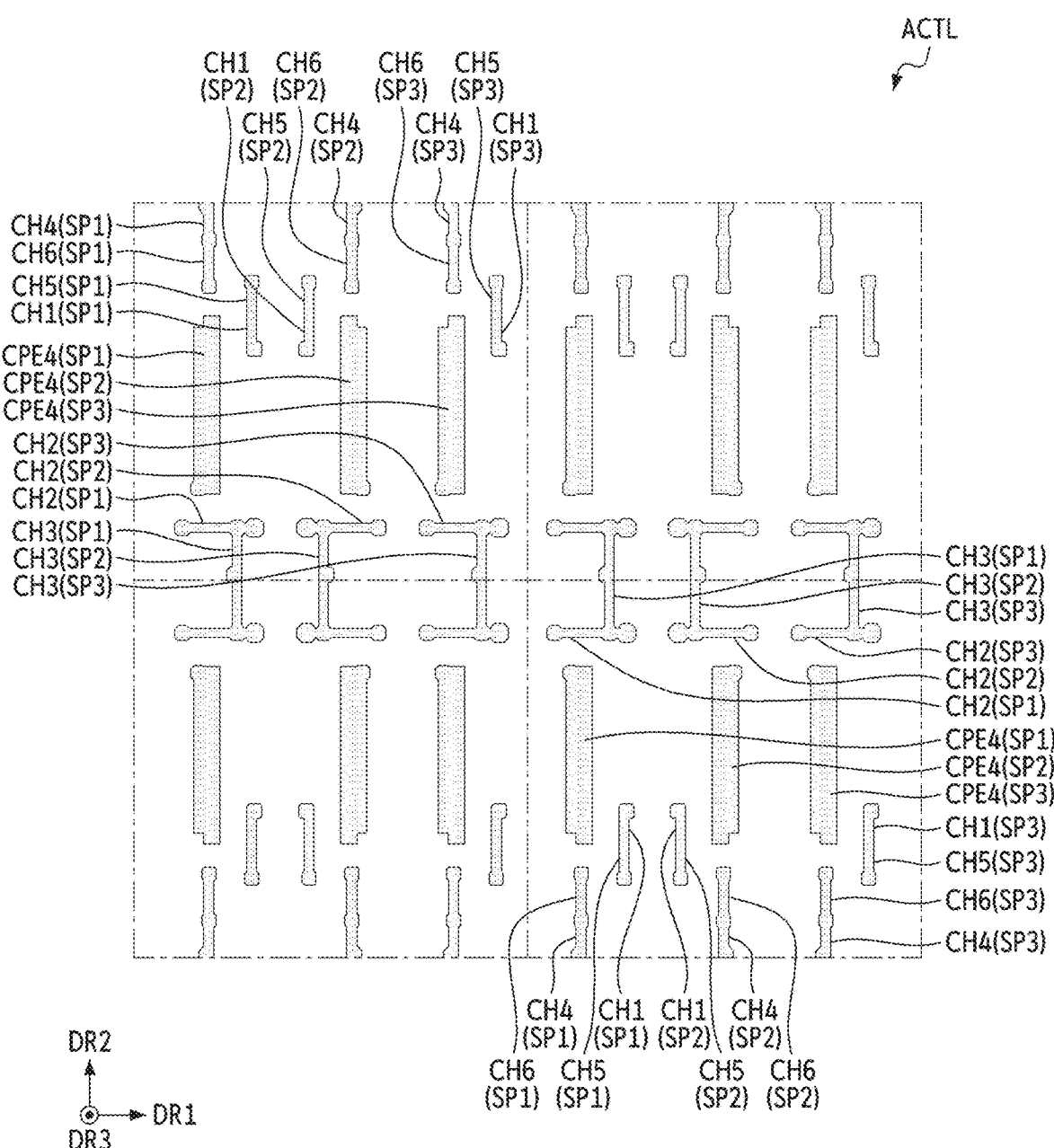
FIG. 11 is a plan diagram showing an active layer according to an embodiment.
Figure 12:
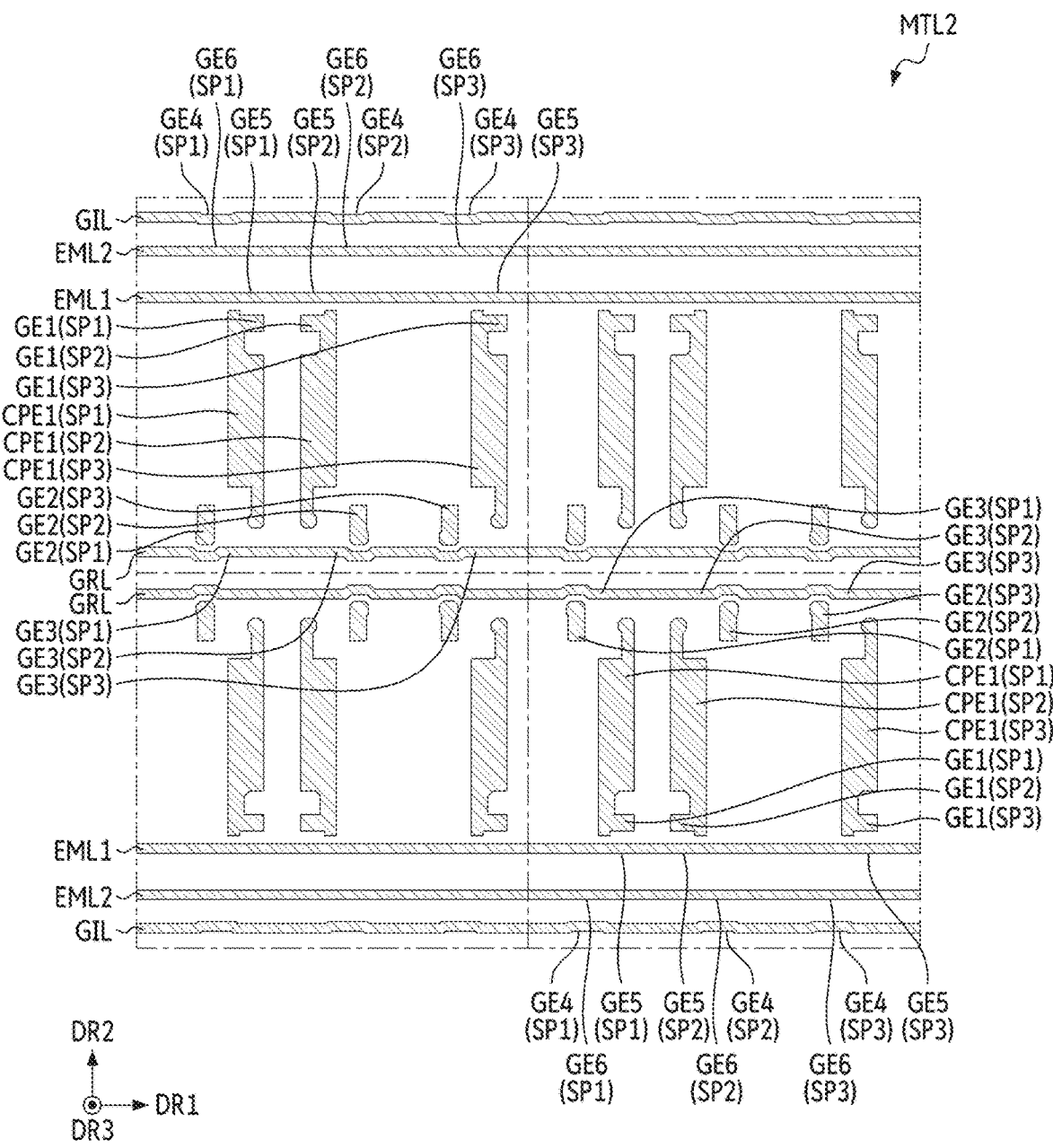
FIG. 12 is a plan diagram showing a second conductive layer according to an embodiment.
Figure 13:
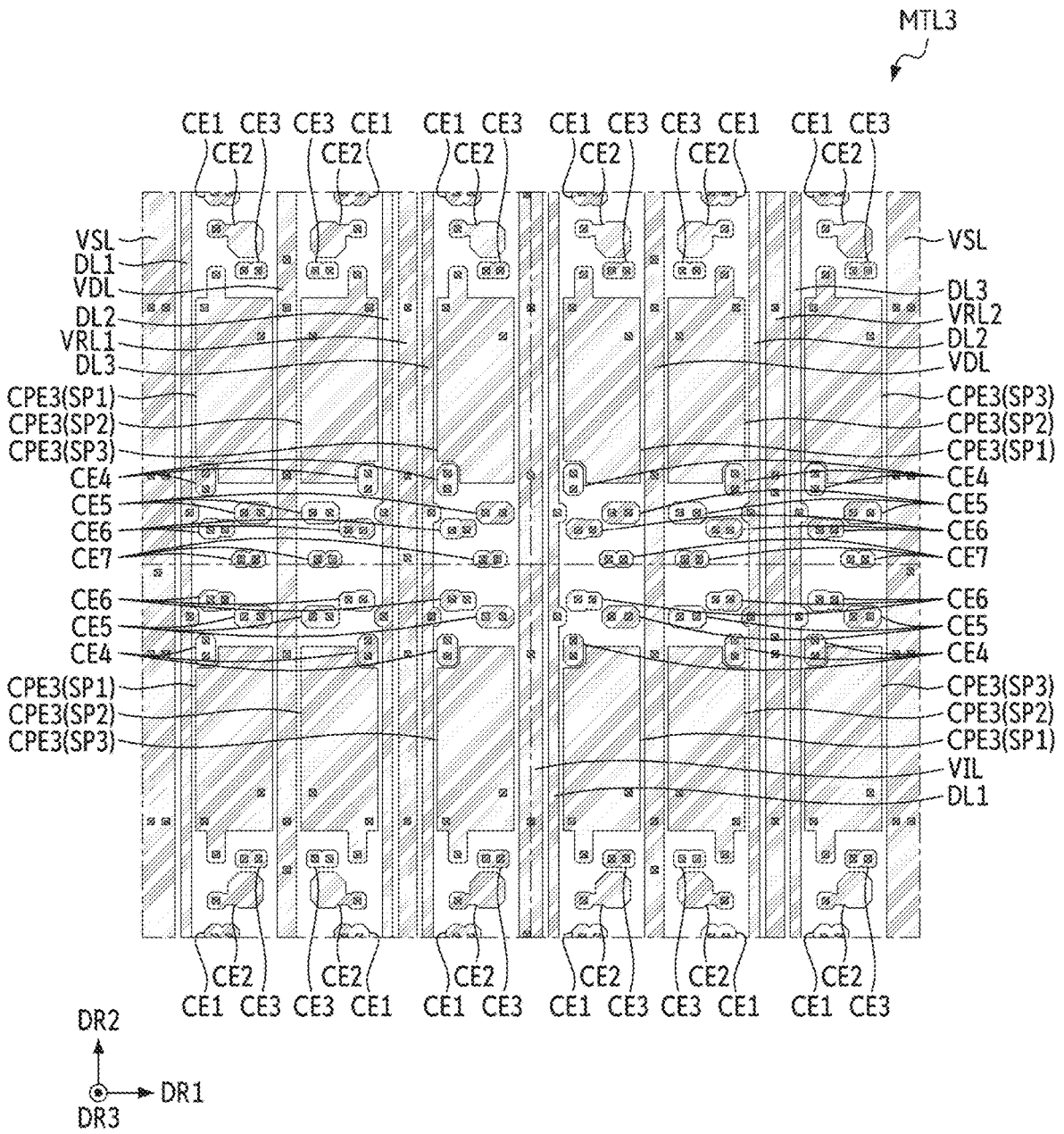
FIG. 13 is a plan diagram showing a third conductive layer according to an embodiment.
Figure 14:
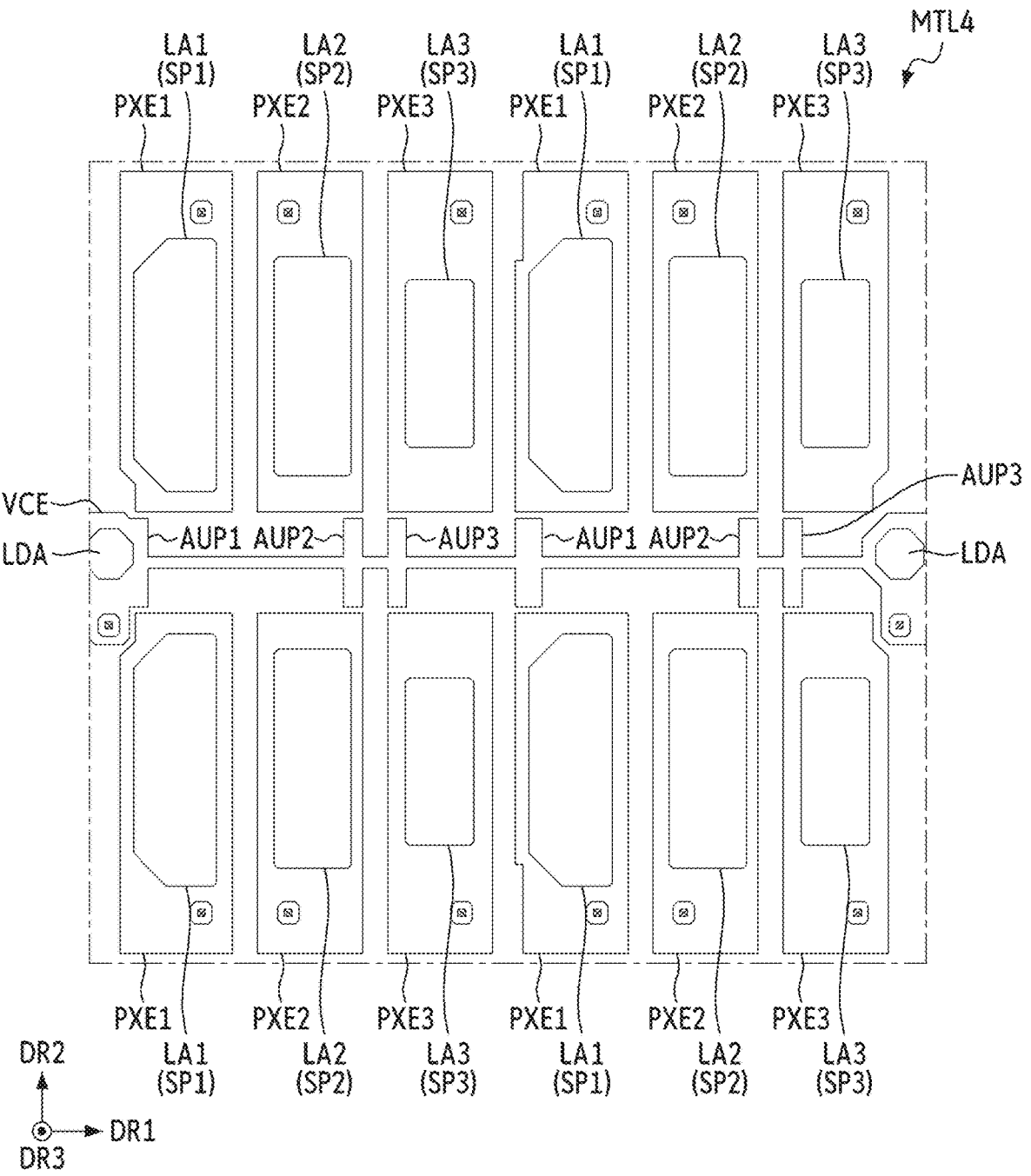
FIG. 14 is a plan diagram showing a fourth conductive layer according to an embodiment.
Figure 15:
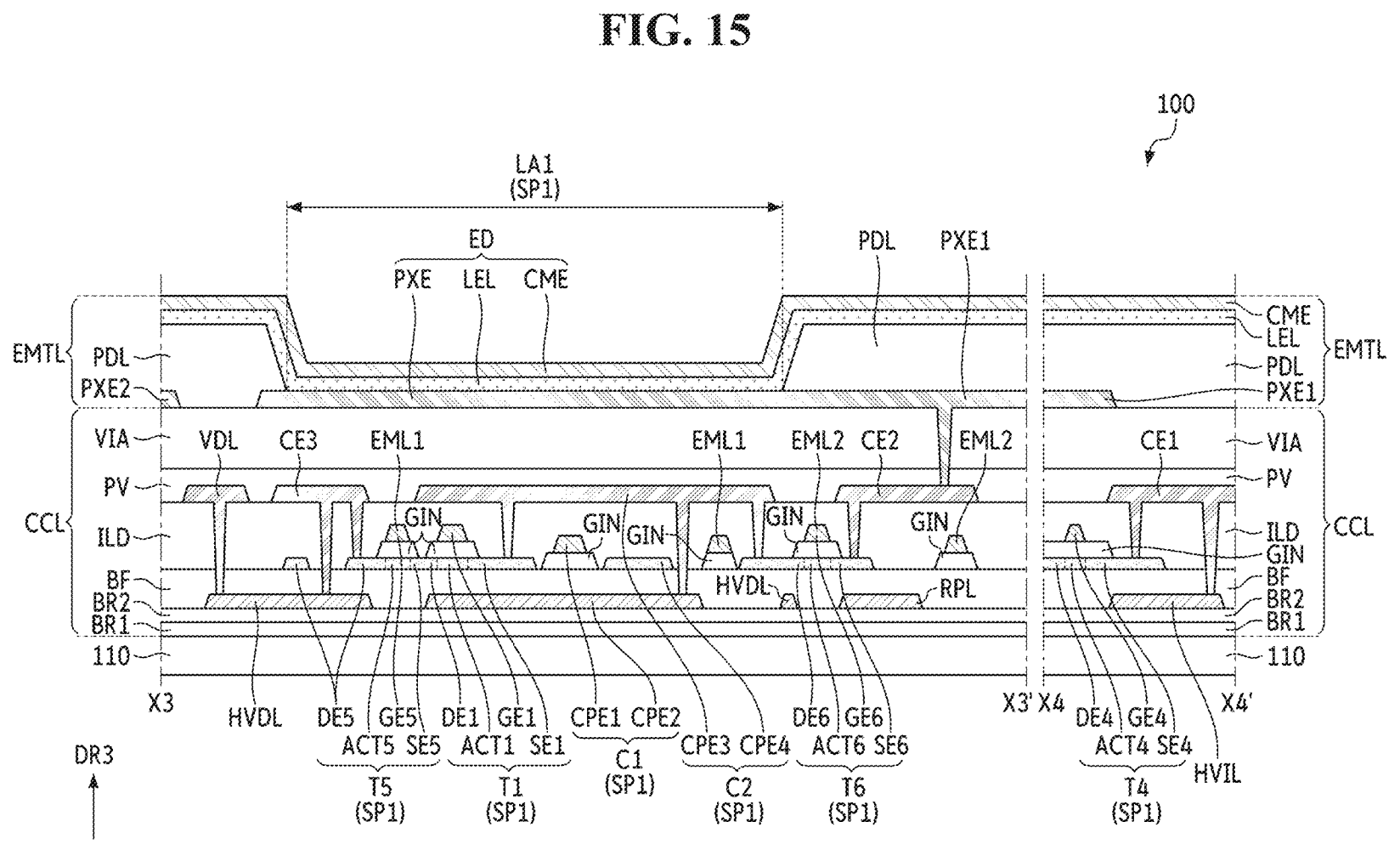
Figure 16:
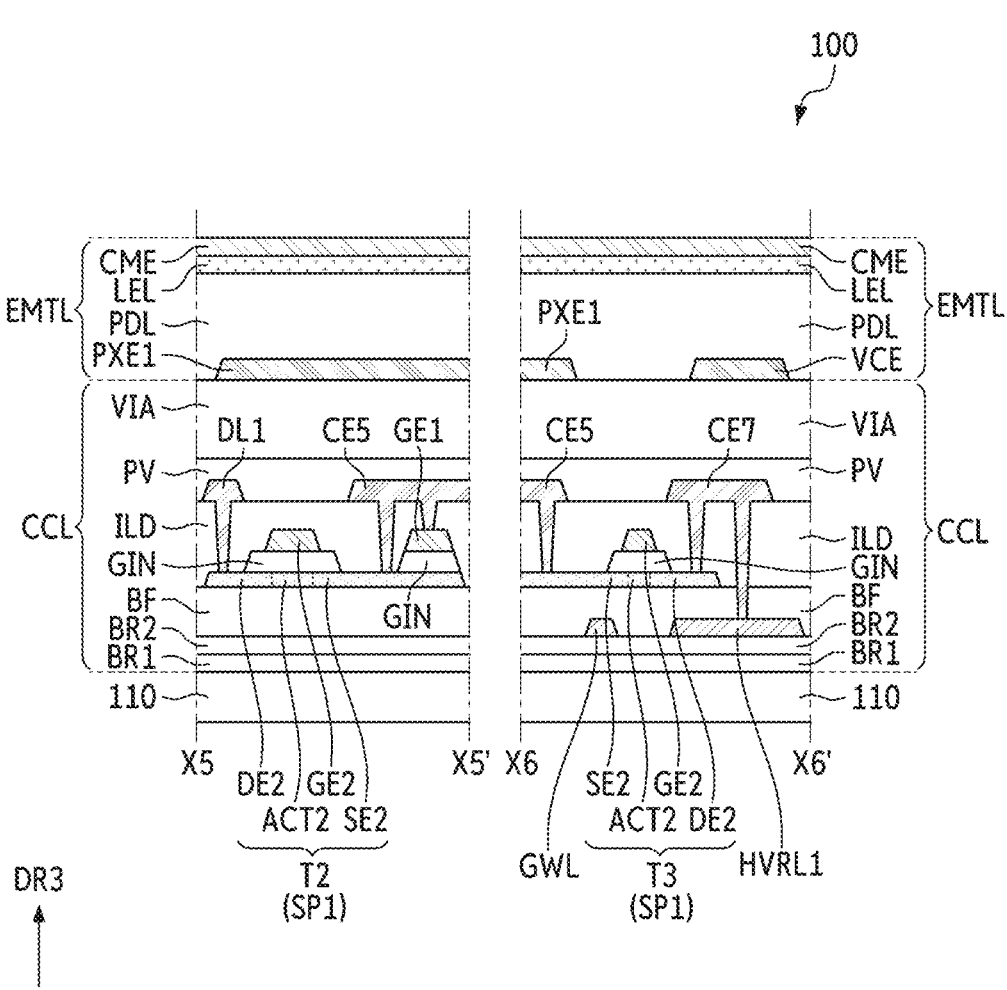
FIG. 16 is a schematic cross-sectional view of the display substrate taken along lines X5-X5' and X6-X6' of FIG. 9.

FIG. 8 is a plan diagram illustrating wires of a display substrate according to an embodiment. FIG. 9 is an enlarged view of area A of FIG. 8. FIG. 10 is a plan diagram showing a first conductive layer according to an embodiment. FIG. 11 is a plan diagram showing an active layer according to an embodiment. FIG. 12 is a plan diagram showing a second conductive layer according to an embodiment. FIG. 13 is a plan diagram showing a third conductive layer according to an embodiment. FIG. 14 is a plan diagram showing a fourth conductive layer according to an embodiment. FIG. 15 is a schematic cross-sectional view of the display substrate taken along lines X3-X3' and X4-X4' of FIG. 9. FIG. 16 is a schematic cross-sectional view of the display substrate taken along lines X5-X5' and X6-X6' of FIG. 9.

FIG. 8 is a plan diagram in which the plan diagrams of FIGS. 10 to 14 are merged. FIG. 9 is a plan diagram illustrating the first to sixth transistors T1 to T6, the first capacitor C1, and the second capacitor C2 by enlarging area A of FIG. 8. Although FIGS. 15 and 16 illustrate the light emitting layer LEL and the common electrode CME, the illustration of the light emitting layer LEL and the common electrode CME may be omitted in FIGS. 8 to 14 for simplicity of description. Since the cross sections of the first to sixth transistors T1 to T6, the first capacitor C1, and the second capacitor C2 of each of the first to third pixels SP1, SP2, and SP3 are similar to each other, the cross sections of the first to sixth transistors T1 to T6, the first capacitor C1, and the second capacitor C2 of the first pixel SP1 are illustrated representatively in FIGS. 15 and 16.

Referring to FIGS. 8 to 16 in addition to FIGS. 3, 5, and 7, the display substrate 100 may include the first substrate 110, the circuit layer CCL, and the light emitting element layer EMTL.

The first substrate 110 may include a transparent material. For example, the first substrate 110 may include a transparent insulating material such as glass, quartz, or the like within the spirit and the scope of the disclosure. The first substrate 110 may be a rigid substrate. However, the first substrate 110 is not limited thereto, and may include plastic such as polyimide, and may have flexible properties that allow it to be warped, bent, folded, or rolled.

The circuit layer CCL may be disposed on the first substrate 110. The circuit layer CCL may include a first barrier film BR1, a second barrier film BR2, a first conductive layer MTL1, a buffer film BF, an active layer ACTL, a gate insulating film GIN, a second conductive layer MTL2, an interlayer insulating film ILD, a third conductive layer MTL3, a passivation film PV, and a via film VIA.

The first barrier film BR1 may be disposed on the first substrate 110. For example, the first barrier film BR1 may be disposed on the entire surface of the first substrate 110. The first barrier film BR1 may be a film for protecting the transistors T of the circuit layer CCL and the light emitting layer LEL of the light emitting element layer EMTL from moisture permeating through the first substrate 110 which is susceptible to moisture permeation. The first barrier film BR1 may be formed as inorganic films that may be alternately stacked each other. For example, the first barrier film BR1 may be formed of a single film or multiple films in which one or more inorganic films of a silicon nitride layer, a silicon oxynitride layer, a silicon oxide layer, a titanium oxide layer and an aluminum oxide layer may be alternately stacked each other.

The second barrier film BR2 may be disposed on the first barrier film BR1. For example, the second barrier film BR2 may be disposed on the entire surface of the first barrier film BR1. The second barrier film BR2 may be a film for protecting the transistors T of the circuit layer CCL and the light emitting layer LEL of the light emitting element layer EMTL from moisture permeating through the first substrate 110 which is susceptible to moisture permeation. The second barrier film BR2 may be formed as inorganic films that may be alternately stacked each other. For example, the second barrier film BR2 may be formed of a single film or multiple films in which one or more inorganic films of a silicon nitride layer, a silicon oxynitride layer, a silicon oxide layer, a titanium oxide layer and an aluminum oxide layer may be alternately stacked each other.

The first conductive layer MTL1 may be disposed on the second barrier film BR2. The first conductive layer MTL1 may include a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

In an embodiment, as shown in FIG. 10, the first conductive layer MTL1 may include a horizontal initialization power line HVIL, a repair line RPL, a first horizontal driving power line HVDL, a second horizontal driving power line HVSL, a first horizontal reference power line HVRL1, a second horizontal reference power line HVRL2, and a first gate line GWL. The first conductive layer MTL1 may further include a second capacitor electrode CPE2 and first to fifth auxiliary electrodes AUE1 to AUE5. In an embodiment, the horizontal initialization power line HVIL, the first horizontal driving power line HVDL, the second horizontal driving power line HVSL, the first horizontal reference power line HVRL1, and the second horizontal reference power line HVRL2 may be included in a horizontal power line. A sixth auxiliary electrodes AUE6 may also be included in FIG. 10.

The buffer film BF may be disposed on the first metal layer MTL1. The buffer film BF may be formed of a single film or multiple films in which one or more inorganic films of a silicon nitride layer, a silicon oxynitride layer, a silicon oxide layer, a titanium oxide layer and an aluminum oxide layer may be alternately stacked each other.

The active layer ACTL may be disposed on the buffer film BF. The active layer ACTL may include polycrystalline silicon, monocrystalline silicon, low-temperature polycrystalline silicon, amorphous silicon, or an oxide semiconductor material.

In an embodiment, as shown in FIG. 11, the active layer ACTL may include first to sixth semiconductor regions CH1 to CH6, and a fourth capacitor electrode CPE4.

The gate insulating film GIN may be disposed on the buffer film BF and the active layer ACTL. The gate insulating film GIN may be formed of a single film or multiple films in which one or more inorganic films of a silicon nitride layer, a silicon oxynitride layer, a silicon oxide layer, a titanium oxide layer and an aluminum oxide layer may be alternately stacked each other.

The second conductive layer MTL2 may be disposed on the gate insulating film GIN. The second conductive layer MTL2 may include a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

In an embodiment, as shown in FIG. 12, the second conductive layer MTL2 may include the second gate line GIL, the third gate line GRL, the first emission control line EML1, and the second emission control line EML2. The second conductive layer MTL2 may further include first to sixth gate electrodes GE1 to GE6, and a first capacitor electrode CPE1.

The interlayer insulating film ILD may be disposed on the second conductive layer MTL2. The interlayer insulating film ILD may be formed of a single film or multiple films in which one or more inorganic films of a silicon nitride layer, a silicon oxynitride layer, a silicon oxide layer, a titanium oxide layer and an aluminum oxide layer may be alternately stacked each other.

The third conductive layer MTL3 may be disposed on the interlayer insulating film ILD. The third conductive layer MTL3 may include a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

In an embodiment, as shown in FIG. 13, the third conductive layer MTL3 may include the first to third data lines DL1, DL2, and DL3, the first driving power line VDL, the second driving power line VSL, the first reference power line VRL1, the second reference power line VRL2, and the initialization power line VIL. The third conductive layer MTL3 may further include a third capacitor electrode CPE3, and first to seventh connection electrodes CE1 to CE7.

The passivation film PV may be disposed on the third conductive layer MTL3. The passivation film PV may be formed of a single film or multiple films in which one or more inorganic films of a silicon nitride layer, a silicon oxynitride layer, a silicon oxide layer, a titanium oxide layer and an aluminum oxide layer may be alternately stacked each other. However, the passivation film PV is not limited thereto, and may be made of an organic insulating material such as polyimide (PI).

The via film VIA may be disposed on the passivation film PV. The via film VIA may include an organic layer such as an acryl resin, an epoxy resin, a phenolic resin, a polyamide resin, a polyimide resin, or the like within the spirit and the scope of the disclosure. The via film VIA may compensate for the stepped portion caused by lower conductive layers and may flatten the top surface of the circuit layer CCL.

The light emitting element layer EMTL may include a fourth conductive layer MTL4, the pixel defining film PDL, the light emitting layer LEL, and the common electrode CME.

The pixel defining film PDL, the light emitting layer LEL, and the common electrode CME have been described above with reference to FIG. 9, so that the description thereof may be omitted.

The fourth conductive layer MTLA may be disposed on the circuit layer CCL. For example, the fourth conductive layer MTL4 may be disposed on the via film VIA. The fourth conductive layer MTL4 may have a stacked structure formed by stacking a material layer having a high work function, such as indium tin oxide (ITO), indium zinc oxide (IZO), zinc oxide (ZnO) and indium oxide (In$_2$O$_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof. The material layer having a high work function may be disposed above the reflective material layer and disposed closer to the light emitting layer LEL. The fourth conductive layer MTL4 may have a multilayer structure such as ITO/Mg, ITO/MgF, ITO/Ag and ITO/Ag/ITO, but is not limited thereto.

In an embodiment, the fourth conductive layer MTL4 may include the pixel electrode PXE and a common electrode auxiliary electrode VCE.

In the display device 10 according to an embodiment, the number of stacked circuit layers CCL on which the above-described wires and pixel circuits PC are disposed is minimized, so that the number of masks required for patterning of each layer is reduced and, thus, process efficiency may be improved.

Hereinafter, wires connected to the pixel circuit PC will be described with reference to FIG. 8 and the like within the spirit and the scope of the disclosure.

The gate lines GL may extend in the first direction DR1 and may be spaced apart from each other in the second direction DR2. The gate lines GL may receive the gate signals GS from the first driver 120 and supply the gate signals GS to the first to third pixels SP1, SP2, and SP3.

The first gate lines GWL may extend in the first direction DR1 and may be spaced apart from each other in the second direction DR2. The first gate lines GWL may receive the first gate signal GW from the first driver 120 and supply the first gate signal GW to the first to third pixels SP1, SP2, and SP3. For example, the first gate lines GWL may be connected to a second gate electrode GE2 of the second transistor T2 through a sixth connection electrode CE6, and may supply the first gate signal GW to the first to third pixels SP1, SP2, and SP3 through the second gate electrode GE2 of the second transistor T2 and the sixth connection electrode CE6.

The second gate lines GIL may extend in the first direction DR1 and may be spaced apart from each other in the second direction DR2. The second gate lines GIL may receive the second gate signal GI from the first driver 120 and supply the second gate signal GI to the first to third pixels SP1, SP2, and SP3. For example, the second gate lines GIL may be connected to a fourth gate electrode GE4 of the fourth transistor T4, and may supply the second gate signal GI to the first to third pixels SP1, SP2, and SP3 through the fourth gate electrode GE4 of the fourth transistor T4.

The third gate lines GRL may extend in the first direction DR1 and may be spaced apart from each other in the second direction DR2. The third gate lines GRL may receive the third gate signal GR from the first driver 120 and supply the third gate signal GR to the first to third pixels SP1, SP2, and SP3. For example, the third gate lines GRL may be connected to a third gate electrode GE3 of the third transistor T3, and may supply the third gate signal GR to the first to third pixels SP1, SP2, and SP3 through the third gate electrode GE3 of the third transistor T3.

The data lines DL may extend in the second direction DR2 and may be spaced apart from each other in the first direction DR1. The data lines DL may receive the data signal DATA from the second driver 130 and supply the data signal DATA to the first to third pixels SP1, SP2, and SP3.

The first data lines DL1 may extend in the second direction DR2 and may be spaced apart from each other in the first direction DR1. The first data lines DL1 may receive the data signal DATA from the second driver 130 and supply the data signal DATA to the first pixel SP1. For example, the first data lines DL1 may be connected to a second semiconductor region CH2 of the second transistor T2 of the first pixel SP1, and may supply the data signal DATA to the first pixel SP1 through a second drain electrode DE2 of the second transistor T2 of the first pixel SP1.

The second data lines DL2 may extend in the second direction DR2 and may be spaced apart from each other in the first direction DR1. The second data lines DL2 may receive the data signal DATA from the second driver 130 and supply the data signal DATA to the second pixel SP2. For example, the second data lines DL2 may be connected to the second semiconductor region CH2 of the second transistor T2 of the second pixel SP2, and supply the data signal DATA to the second pixel SP2 through the second drain electrode DE2 of the second transistor T2 of the second pixel SP2.

The third data lines DL3 may extend in the second direction DR2 and may be spaced apart from each other in the first direction DR1. The third data lines DL3 may receive the data signal DATA from the second driver 130 and supply the data signal DATA to the third pixel SP3. For example, the third data lines DL3 may be connected to the second semiconductor region CH2 of the second transistor T2 of the third pixel SP3, and may supply the data signal DATA to the third pixel SP3 through the second drain electrode DE2 of the second transistor T2 of the third pixel SP3.

The first driving power lines VDL may extend in the second direction DR2 and may be spaced apart from each other in the first direction DR1. The first driving power lines VDL may supply the first pixel voltage ELVDD received from the power supply unit to the first to third pixels SP1, SP2, and SP3. For example, the first driving power lines VDL may be connected to the first horizontal driving power lines HVDL, and may supply the first pixel voltage ELVDD to the first to third pixels SP1, SP2, and SP3 through the first horizontal driving power lines HVDL.

The second driving power lines VSL may extend in the second direction DR2 and may be spaced apart from each other in the first direction DR1. The second driving power lines VSL may supply the second pixel voltage ELVSS received from the power supply unit to the first to third pixels SP1, SP2, and SP3. For example, the first driving power lines VDL may be connected to the first horizontal driving power lines HVDL, and may supply the first pixel voltage ELVDD to the first to third pixels SP1, SP2, and SP3 through the first horizontal driving power lines HVDL. For example, the second driving power lines VSL may be connected to the second horizontal driving power lines HVSL, and may supply the second pixel voltage ELVSS to the first to third pixels SP1, SP2, and SP3 through the second horizontal driving power lines HVSL.

The first reference power lines VRL1 may extend in the second direction DR2 and may be spaced apart from each other in the first direction DR1. The first reference power lines VRL1 may supply the first reference voltage VREF1 received from the power supply unit to the first to third pixels SP1, SP2, and SP3. For example, the first reference power lines VRL1 may be connected to the first horizontal reference power lines VRL1, and may supply the first reference voltage VREF1 to the first to third pixels SP1, SP2, and SP3 through the first horizontal reference power lines VRL1.

The second reference power lines VRL2 may extend in the second direction DR2 and may be spaced apart from each other in the first direction DR1. The second reference power lines VRL2 may supply the second reference voltage VREF2 received from the power supply unit to the first to third pixels SP1, SP2, and SP3. For example, the second reference power lines VRL2 may be connected to the second horizontal reference power lines VRL2, and may supply the second reference voltage VREF2 to the first to third pixels SP1, SP2, and SP3 through the second horizontal reference power lines VRL2.

The initialization power lines VIL may extend in the second direction DR2 and may be spaced apart from each other in the first direction DR1. The initialization power lines VIL may supply the initialization voltage VINT received from the power supply unit to the first to third pixels SP1, SP2, and SP3. For example, the initialization power lines VIL may be connected to the horizontal initialization power lines HVIL, and may supply the first reference voltage VREF1 to the first to third pixels SP1, SP2, and SP3 through the horizontal initialization power lines HVIL.

The first emission control lines EML1 may extend in the first direction DR1 and may be spaced apart from each other in the second direction DR2. The first emission control lines EML1 may receive the first emission control signal EM1 from the first driver 120 and supply the first emission control signal EM1 to the first to third pixels SP1, SP2, and SP3. For example, the first emission control lines EML1 may be connected to a fifth gate electrode GE5 of the fifth transistor T5, and may supply the first emission control signal EM1 to the first to third pixels SP1, SP2, and SP3 through the fifth gate electrode GE5 of the fifth transistor T5.

The second emission control lines EML2 may extend in the first direction DR1 and may be spaced apart from each other in the second direction DR2. The second emission control lines EML2 may receive the second emission control signal EM2 from the first driver 120 and supply the second emission control signal EM2 to the first to third pixels SP1, SP2, and SP3. For example, the second emission control lines EML2 may be connected to a sixth gate electrode GE6 of the sixth transistor T6, and may supply the second emission control signal EM2 to the first to third pixels SP1, SP2, and SP3 through the sixth gate electrode GE6 of the sixth transistor T6.

The horizontal initialization power lines HVIL may extend in the first direction DR1 and may be spaced apart from each other in the second direction DR2. The horizontal initialization power lines HVIL may be connected to the initialization power lines VIL. The horizontal initialization power lines HVIL may receive the initialization voltage VINT from the initialization power lines VIL. The horizontal initialization power lines HVIL may be connected to a fourth source electrode SE4 of the fourth transistor T4 through the first connection electrode CE1, and may supply the initialization voltage VINT to the fourth source electrode SE4 of the fourth transistor T4 through the first connection electrode CE1.

The first horizontal driving power lines HVDL may extend in the first direction DR1 and may be spaced apart from each other in the second direction DR2. The first horizontal driving power lines HVDL may be connected to the first driving power lines VDL. The first horizontal driving power lines HVDL may receive the first pixel voltage ELVDD from the first driving power lines VDL. The first horizontal driving power lines HVDL may be connected to a fifth drain electrode DE5 of the fifth transistor T5 through the third connection electrode CE3, and may supply the first pixel voltage ELVDD to the fifth drain electrode DE5 of the fifth transistor T5 through the third connection electrode CE3.

The second horizontal driving power lines HVSL may extend in the first direction DR1 and may be spaced apart from each other in the second direction DR2. The second horizontal driving power lines HVSL may be connected to the second driving power lines VSL. The second horizontal driving power lines HVSL may receive the second pixel voltage ELVSS from the second driving power lines VSL. The second horizontal driving power lines HVSL may be connected to the second electrode (for example, the common electrode CME) of the light emitting element ED, and may supply the second pixel voltage ELVSS to the second electrode of the light emitting element ED.

The first horizontal reference power lines HVRL1 may extend in the first direction DR1 and may be spaced apart from each other in the second direction DR2. The first horizontal reference power lines HVRL1 may be connected to the first reference power lines VRL1. The first horizontal reference power lines HVRL1 may receive the first reference voltage VREF1 from the first reference power lines VRL1. The first horizontal reference power lines HVRL1 may be connected to a third source electrode SE3 of the third transistor T3 through the seventh connection electrode CE7, and may supply the first reference voltage VREF1 to the third source electrode SE3 of the third transistor T3 through the seventh connection electrode CE7.

The second horizontal reference power lines HVRL2 may extend in the first direction DR1 and may be spaced apart from each other in the second direction DR2. The second horizontal reference power lines HVRL2 may be connected to the second reference power lines VRL2. The second horizontal reference power lines HVRL2 may receive the second reference voltage VREF2 from the second reference power lines VRL2. The second horizontal reference power lines HVRL2 may be connected to the fourth capacitor electrode CPE4 of the second capacitor C2 through the fourth connection electrode CE4, and may supply the second reference voltage VREF2 to the fourth capacitor electrode CPE4 of the second capacitor C2 through the fourth connection electrode CE4.

The repair lines RPL may extend in the first direction DR1 and may be spaced apart from each other in the second direction DR2. The repair lines RPL may be connected to dummy pixels disposed in the non-display area NDA. If a problem occurs in the pixel circuit PC of a given pixel SP, the light emitting element ED of the pixel SP in which the problem has occurred and the pixel circuit PC of the pixel SP in which the problem has occurred are disconnected, and the light emitting element ED of the pixel SP in which the problem has occurred may be driven through the repair line RPL connected to the pixel circuit PC of the dummy pixel.

As shown in FIGS. 5 and 8, each one of the horizontal initialization power line HVIL, the repair line RPL, the first horizontal driving power line HVDL, the second horizontal reference power line HVRL2, the first gate line GWL, the second gate line GIL, the third gate line GRL, the first emission control line EML1, and the second emission control line EML2 may be disposed in every row. On the other hand, each one of the first horizontal reference power line HVRL1 and the second horizontal driving power line HVSL may be disposed in every two rows.

For example, the horizontal initialization power line HVIL, the second gate line GIL, the repair line RPL, the second emission control line EML2, the first horizontal driving power line HVDL, the first emission control line EML1, the second horizontal reference power line HVRL2, the first gate line GWL, and the third gate line GRL may be sequentially disposed in the opposite direction of the second direction DR2 in the first row CR1 of the display area DA. The horizontal initialization power line HVIL, the second gate line GIL, the repair line RPL, the second emission control line EML2, the first horizontal driving power line HVDL, the first emission control line EML1, the second horizontal reference power line HVRL2, the first gate line GWL, and the third gate line GRL may be sequentially disposed in the second direction DR2 in the second row CR2 of the display area DA.

The second horizontal driving power line HVSL and the first horizontal reference power line HVRL1 may be disposed between the third gate line GRL of the first row CR1 and the third gate line GRL of the second row CR2. The first horizontal reference power line HVRL1 may be disposed adjacent to the first row CR1, and the second horizontal driving power line HVSL may be disposed adjacent to the second row CR2.

In an embodiment, the disposition of horizontal wires in the first row CR1 and the disposition of horizontal wires in the second row CR2 except the second horizontal driving power line HVSL and the first horizontal reference power line HVRL1 may have a vertically symmetrical relationship. For example, the disposition of the horizontal initialization power line HVIL, the second gate line GIL, the repair line RPL, the second emission control line EML2, the first horizontal driving power line HVDL, and the first emission control line EML1 that are disposed in the first row CR1 and the disposition of the horizontal initialization power line HVIL, the second gate line GIL, the repair line RPL, the second emission control line EML2, the first horizontal driving power line HVDL, and the first emission control line EML1 that are disposed in the second row CR2 may have a vertically symmetrical relationship.

For example, the horizontal initialization power line HVIL, the second gate line GIL, the repair line RPL, the second emission control line EML2, the first horizontal driving power line HVDL, and the first emission control line EML1 that are disposed in the first row CR1 may be disposed on one side or a side in the second direction DR2 of the capacitor electrodes CPE1, CPE2, CPE3, and CPE4 of the pixels SP in the first row CR1, and the second horizontal reference power line HVRL2, the first gate line GWL, and the third gate line GRL that are disposed in the first row CR1 may be disposed on the other side in the second direction DR2 of the capacitors electrodes CPE1, CPE2, CPE3, and CPE4 of the pixels SP in the first row CR1.

Further, the horizontal initialization power line HVIL, the second gate line GIL, the repair line RPL, the second emission control line EML2, the first horizontal driving power line HVDL, and the first emission control line EML1 that are disposed in the second row CR2 may be disposed on the other side in the second direction DR2 of the capacitor electrodes CPE1, CPE2, CPE3, and CPE4 of the pixels SP in the second row CR2, and the second horizontal reference power line HVRL2, the first gate line GWL, and the third gate line GRL that are disposed in the second row CR2 may be disposed on one side or a side in the second direction DR2 of the capacitor electrodes CPE1, CPE2, CPE3, and CPE4 of the pixels SP in the second row CR2.

In the display device 10 according to an embodiment, the second horizontal driving power line HVSL and the first horizontal reference power line HVRL1 are commonly connected to the pixel SP in the first row CR1 and the pixel SP in the second row CR2, and the horizontal wires except the second horizontal driving power line HVSL and the first horizontal reference power line HVRL1 are disposed to be vertically symmetrical to each other in the first row CR1 and the second row CR2, so that even if the space efficiency is improved and the pixel density increases, the area of the capacitor electrodes CPE1, CPE2, CPE3, and CPE4 disposed in each of the first row CR1 and the second row CR2 may be sufficiently secured.

As shown in FIGS. 5 and 8, each one of the first to third data lines DL1, DL2, and DL3 and the first driving power line VDL may be disposed in every column. On the other hand, each one of the second driving power line VSL, the first reference power line VRL1, the second reference power line VRL2, and the initialization power line VIL may be disposed in every two columns.

For example, the second driving power line VSL, the first data line DL1 of the first column CC1, the first driving power line VDL of the first column CC1, the second data line DL2 of the first column CC1, the first reference power line VRL1, the third data line DL3 of the first column CC1, the initialization power line VIL, the first data line DL1 of the second column CC2, the first driving power line VDL of the second column CC2, the second data line DL2 of the second column CC2, the second reference power line VRL2, and the third data line DL3 of the second column CC2 may be sequentially disposed in the first direction DR1 across the first column CC1 and the second column CC2 of the display area DA.

In the display device 10 according to an embodiment, vertical wires such as the second driving power line VSL, the first reference power line VRL1, the second reference power line VRL2, and the initialization power line VIL are commonly connected to the pixel SP in the first column CC1 and the pixel SP in the second column CC2, so that even if the space efficiency is improved and the pixel density is increased, the area of the capacitor electrodes CPE1, CPE2, CPE3, and CPE4 disposed in each of the first column CC1 and the second column CC2 may be sufficiently secured.

By disposing one first driving power line VDL to which a relatively high voltage is applied in every column, the resistance applied to the first driving power line VDL may be minimized. Further, as described above, in case that the first to third pixels SP1, SP2, and SP3 emit blue light or ultraviolet light, a higher voltage is required compared to in case that they emit red light or green light, so that one first driving power line VDL is disposed in every column to minimize the resistance applied to the first driving power line VDL.

In an embodiment, the width (for example, the width in the first direction DR1) of the second driving power line VSL may be larger than the width (for example, the width in the first direction DR1) of other vertical wires (for example, the first driving power line VDL, the first reference power line VRL1, the initialization power line VIL, and the second reference power line VRL2).

In the display device 10 according to an embodiment, the resistance may be minimized by increasing the width instead of disposing one second driving power line VSL to which a relatively low voltage is applied compared to the first driving power line VDL in every column. Accordingly, the space efficiency may be improved and wiring defects may be minimized.

In an embodiment, the data lines DL may be spaced apart from each other by at least one power line. For example, the first data line DL1 and the second data line DL2 may be spaced apart from each other by the first driving power line VDL, the second data line DL2 and the third data line DL3 may be spaced apart from each other by the first reference power line VRL1 or the second reference power line VRL2, and the third data line DL3 and the first data line DL1 may be spaced apart from each other by the second driving power line VSL or the initialization power line VIL.

In an embodiment, the capacitor electrodes CPE1, CPE2, CPE3, and CPE4 of each of the first to third pixels SP1, SP2, and SP3 may be spaced apart from the capacitor electrodes CPE1, CPE2, CPE3, and CPE4 of the adjacent pixel SP by at least one power line. For example, the capacitor electrodes CPE1, CPE2, CPE3, and CPE4 of the first pixel SP1 and the capacitor electrodes CPE1, CPE2, CPE3, and CPE4 of the second pixel SP2 may be spaced apart from each other by the first driving power line VDL, the capacitor electrodes CPE1, CPE2, CPE3, and CPE4 of the second pixel SP2 and the capacitor electrodes CPE1, CPE2, CPE3, and CPE4 of the third pixel SP3 may be spaced apart from each other by the first reference power line VRL1 or the second reference power line VRL2, and the capacitor electrodes CPE1, CPE2, CPE3, and CPE4 of the third pixel SP3 and the capacitor electrodes CPE1, CPE2, CPE3, and CPE4 of the first pixel SP1 may be spaced apart from each other by the second driving power line VSL or the initialization power line VIL.

In the display device 10 according to an embodiment, at least one power line is disposed between the data lines DL and at least one power line is disposed between the capacitor electrodes CPE1, CPE2, CPE3, and CPE4 of the adjacent pixels SP, so that the power line serves as a shield, thereby preventing a coupling phenomenon between the data lines DL, between the capacitor electrodes CPE1, CPE2, CPE3, and CPE4, or between the data lines DL and the capacitor electrodes CPE1, CPE2, CPE3, and CPE4.

Hereinafter, the first to sixth transistors T1 to T6, the first capacitor C1, and the second capacitor C2 will be described with reference to FIG. 8 and the like within the spirit and the scope of the disclosure.

The pixel circuit PC of the circuit layer CCL may include the first transistor T1, the second transistor T2, the third transistor T3, the fourth transistor T4, the fifth transistor T5, and the sixth transistor T6, the first capacitor C1, and the second capacitor C2. Each of the first pixel SP1, the second pixel SP2, and the third pixel SP3 may include the first transistor T1, the second transistor T2, the third transistor T3, the fourth transistor T4, the fifth transistor T5, the sixth transistor T6, the first capacitor C1, and the second capacitor C2. The structures of the first transistor T1, the second transistor T2, the third transistor T3, the fourth transistor T4, the fifth transistor T5, the sixth transistor T6, the first capacitor C1, and the second capacitor C2 of the first to third pixels SP1, SP2, and SP3 may be substantially the same, so that the first pixel SP1 will be described in the following description.

The first transistor T1 may include a first semiconductor region CH1 and a first gate electrode GE1. The first semiconductor region CH1 may include a first drain electrode DE1, a first active region ACT1, and a first source electrode SE1.

The first active region ACT1 of the first transistor T1 may be disposed in the active layer ACTL, and may overlap the first gate electrode GE1 of the first transistor T1.

The first gate electrode GE1 of the first transistor T1 may be disposed in the second conductive layer MTL2. The first gate electrode GE1 of the first transistor T1 may be connected to the first capacitor electrode CPE1 of the first capacitor C1. The first gate electrode GE1 of the first transistor T1 may be an electrode integrated with the first capacitor electrode CPE1 of the first capacitor C1. The first gate electrode GE1 of the first transistor T1 may be electrically connected to a second source electrode SE2 of the second transistor T2 through a fifth connection electrode CE5 and the first capacitor electrode CPE1 of the first capacitor C1.

The first drain electrode DE1 and the first source electrode SE1 of the first transistor T1 may be disposed in the active layer ACTL. The first drain electrode DE1 and the first source electrode SE1 of the first transistor T1 may be formed by performing heat treatment on a part of the first semiconductor region CH1 to make it conductive. The first drain electrode DE1 and the first source electrode SE1 of the first transistor T1 may become conductive as an N-type semiconductor, but the disclosure is not limited thereto.

The first drain electrode DE1 of the first transistor T1 may be connected to a fifth source electrode SE5 of the fifth transistor T5. The first drain electrode DE1 of the first transistor T1 may be an electrode integrated with the fifth source electrode SE5 of the fifth transistor T5. The first drain electrode DE1 of the first transistor T1 may receive the first pixel voltage ELVDD from the first driving power line VDL through the fifth transistor T5 and the third connection electrode CE3.

The first source electrode SE1 of the first transistor T1 may be connected to the third capacitor electrode CPE3 of the second capacitor C2 through a contact hole penetrating the interlayer insulating film ILD. The first source electrode SE1 of the first transistor T1 may be electrically connected to a sixth drain electrode DE6 of the sixth transistor T6 through the third capacitor electrode CPE3 of the second capacitor C2.

The second transistor T2 may include the second semiconductor region CH2 and the second gate electrode GE2. The second semiconductor region CH2 may include the second drain electrode DE2, a second active region ACT2, and the second source electrode SE2.

The second active region ACT2 of the second transistor T2 may be disposed on the active layer ACTL, and may overlap the second gate electrode GE2 of the second transistor T2.

The second gate electrode GE2 of the second transistor T2 may be disposed in the second conductive layer MTL2. The second gate electrode GE2 of the second transistor T2 may be connected to the first gate line GWL through the sixth connection electrode CE6. The second gate electrode GE2 of the second transistor T2 may receive the first gate signal GW from the first gate line GWL through the sixth connection electrode CE6.

The second drain electrode DE2 and the second source electrode SE2 of the second transistor T2 may be disposed in the active layer ACTL. The second drain electrode DE2 and the second source electrode SE2 of the second transistor T2 may be formed by performing heat treatment on a part of the second semiconductor region CH2 to make it conductive. The second drain electrode DE2 and the second source electrode SE2 of the second transistor T2 may be made conductive as an N-type semiconductor, but the disclosure is not limited thereto.

The second drain electrode DE2 of the second transistor T2 may be connected to the first data line DL1 through a contact hole penetrating the interlayer insulating film ILD. The second drain electrode DE2 of the second transistor T2 may receive the data signal DATA from the first data line DL1.

The second source electrode SE2 of the second transistor T2 may be connected to the first capacitor electrode CPE1 of the first capacitor C1 through the fifth connection electrode CE5. The second source electrode SE2 of the second transistor T2 may be electrically connected to the first gate electrode GE1 of the first transistor T1 through the fifth connection electrode CE5 and the first capacitor electrode CPE of the first capacitor C1. The second source electrode SE2 of the second transistor T2 may supply the gate voltage to the first transistor T1 through the fifth connection electrode CE5 and the first capacitor electrode CPE1 of the first capacitor C1.

The second source electrode SE2 of the second transistor T2 may be connected to a third drain electrode DE3 of the third transistor T3. The second source electrode SE2 of the second transistor T2 may be an electrode integrated with the third drain electrode DE3 of the third transistor T3.

The third transistor T3 may include a third semiconductor region CH3 and the third gate electrode GE3. The third semiconductor region CH3 may include the third drain electrode DE3, a third active region ACT3, and the third source electrode SE3.

The third active region ACT3 of the third transistor T3 may be disposed on the active layer ACTL, and may overlap the third gate electrode GE3 of the third transistor T3.

The third gate electrode GE3 of the third transistor T3 may be disposed in the second conductive layer MTL2. The third gate electrode GE3 of the third transistor T3 may be connected to the third gate line GRL. The third gate electrode GE3 of the third transistor T3 may be a part of the third gate line GRL. The third gate electrode GE3 of the third transistor T3 may receive the third gate signal GR from the third gate line GRL.

The third drain electrode DE3 and the third source electrode SE3 of the third transistor T3 may be disposed in the active layer ACTL. The third drain electrode DE3 and the third source electrode SE3 of the third transistor T3 may be formed by performing heat treatment on a part of the third semiconductor region CH3 to make it conductive. The third drain electrode DE3 and the third source electrode SE3 of the third transistor T3 may be made conductive as an N-type semiconductor, but the disclosure is not limited thereto.

The third drain electrode DE3 of the third transistor T3 may be connected to the second source electrode SE2 of the second transistor T2. The third drain electrode DE3 of the third transistor T3 may be an electrode integrated with the second source electrode SE2 of the second transistor T2. The third drain electrode DE3 of the third transistor T3 may be connected to the first capacitor electrode CPE1 of the first capacitor C1 through the fifth connection electrode CE5.

The third source electrode SE3 of the third transistor T3 may be connected to the first horizontal reference power line HVRL1 through the seventh connection electrode CE7. The third source electrode SE3 of the third transistor T3 may receive the first reference voltage VREF1 from the first reference power line VRL1 through the seventh connection electrode CE7 and the first horizontal reference power line HVRL1.

In an embodiment, the third source electrode SE3 of the third transistor T3 of the first pixel SP1 of the first row CR1 may be connected to the third source electrode SE3 of the third transistor T3 of the first pixel SP1 of the second row CR2. The third source electrode SE3 of the third transistor T3 of the first pixel SP1 of the first row CR1 may be an electrode integrated with the third source electrode SE3 of the third transistor T3 of the first pixel SP1 of the second row CR2. For example, the third semiconductor region CH3 of the third transistor T3 of the first pixel SP1 of the first row CR1 may be integrated with the third semiconductor region CH3 of the third transistor T3 of the first pixel SP1 of the second row CR2.

The fourth transistor T4 may include a fourth semiconductor region CH4 and the fourth gate electrode GE4. The fourth semiconductor region CH4 may include a fourth drain electrode DE4, a fourth active region ACT4, and the fourth source electrode SE4.

The fourth active region ACT4 of the fourth transistor T4 may be disposed in the active layer ACTL, and may overlap the fourth gate electrode GE4 of the fourth transistor T4.

The fourth gate electrode GE4 of the fourth transistor T4 may be disposed in the second conductive layer MTL2. The fourth gate electrode GE4 of the fourth transistor T4 may be connected to the second gate line GIL. The fourth gate electrode GE4 of the fourth transistor T4 may be a part of the second gate line GIL. The fourth gate electrode GE4 of the fourth transistor T4 may receive the second gate signal GI from the second gate line GIL.

The fourth drain electrode DE4 and the fourth source electrode SE4 of the fourth transistor T4 may be disposed in the active layer ACTL. The fourth drain electrode DE4 and the fourth source electrode SE4 of the fourth transistor T4 may be formed by performing heat treatment on a part of the fourth semiconductor region CH4 to make it conductive. The fourth drain electrode DE4 and the fourth source electrode SE4 of the fourth transistor T4 may be made conductive as an N-type semiconductor, but the disclosure is not limited thereto.

The fourth drain electrode DE4 of the fourth transistor T4 may be connected to a sixth source electrode SE6 of the sixth transistor T6. The fourth drain electrode DE4 of the fourth transistor T4 may be an electrode integrated with the sixth source electrode SE6 of the sixth transistor T6. The fourth drain electrode DE4 of the fourth transistor T4 may be electrically connected to the first pixel electrode PXE1 through the second connection electrode CE2.

The fourth source electrode SE4 of the fourth transistor T4 may be connected to the horizontal initialization power line HVIL through the first connection electrode CE1. The fourth source electrode SE4 of the fourth transistor T4 may receive the initialization voltage VINT from the initialization power line VIL through the first connection electrode CE1 and the horizontal initialization power line HVIL.

The fifth transistor T5 may include a fifth semiconductor region CH5 and the fifth gate electrode GE5. The fifth semiconductor region CH5 may include the fifth drain electrode DE5, a fifth active region ACT5, and a fifth source electrode SE5.

The fifth active region ACT5 of the fifth transistor T5 may be disposed in the active layer ACTL and may overlap the fifth gate electrode GE5 of the fifth transistor T5.

The fifth gate electrode GE5 of the fifth transistor T5 may be disposed in the second conductive layer MTL2. The fifth gate electrode GE5 of the fifth transistor T5 may be connected to the first emission control line EML1. The fifth gate electrode GE5 of the fifth transistor T5 may be a part of the first emission control line EML1. The fifth gate electrode GE5 of the fifth transistor T5 may receive the first emission control signal EM1 from the first emission control line EML1.

The fifth drain electrode DE5 and the fifth source electrode SE5 of the fifth transistor T5 may be disposed in the active layer ACTL. The fifth drain electrode DE5 and the fifth source electrode SE5 of the fifth transistor T5 may be formed by performing heat treatment on a part of the fifth semiconductor region CH5 to make it conductive. The fifth drain electrode DE5 and the fifth source electrode SE5 of the fifth transistor T5 may be made conductive as an N-type semiconductor, but the disclosure is not limited thereto.

The fifth drain electrode DE5 of the fifth transistor T5 may be connected to the first horizontal driving power line HVDL through the third connection electrode CE3. The fifth drain electrode DE5 of the fifth transistor T5 may receive the first pixel voltage ELVDD from the first driving power line VDL through the third connection electrode CE3 and the first horizontal driving power line HVDL.

The fifth source electrode SE5 of the fifth transistor T5 may be connected to the first drain electrode DE1 of the first transistor T1. The fifth source electrode SE5 of the fifth transistor T5 may be an electrode integrated with the first drain electrode DE1 of the first transistor T1.

The sixth transistor T6 may include a sixth semiconductor region CH6 and the sixth gate electrode GE6. The sixth semiconductor region CH6 may include the sixth drain electrode DE6, a sixth active region ACT6, and the sixth source electrode SE6.

The sixth active region ACT6 of the sixth transistor T6 may be disposed in the active layer ACTL, and may overlap the sixth gate electrode GE6 of the sixth transistor T6.

The sixth gate electrode GE6 of the sixth transistor T6 may be disposed in the second conductive layer MTL2. The sixth gate electrode GE6 of the sixth transistor T6 may be connected to the second emission control line EML2. The sixth gate electrode GE6 of the sixth transistor T6 may be a part of the second emission control line EML2. The sixth gate electrode GE6 of the sixth transistor T6 may receive the second emission control signal EM2 from the second emission control line EML2.

The sixth drain electrode DE6 and the sixth source electrode SE6 of the sixth transistor T6 may be disposed in the active layer ACTL. The sixth drain electrode DE6 and the sixth source electrode SE6 of the sixth transistor T6 may be formed by performing heat treatment on a part of the sixth semiconductor region CH6 to make it conductive. The sixth drain electrode DE6 and the sixth source electrode SE6 of the sixth transistor T6 may be made conductive as an N-type semiconductor, but the disclosure is not limited thereto.

The sixth drain electrode DE6 of the sixth transistor T6 may be connected to the third capacitor electrode CPE3 of the second capacitor C2 through a contact hole penetrating the interlayer insulating film ILD. The sixth drain electrode DE6 of the sixth transistor T6 may be connected to the first source electrode SE1 of the first transistor T1 through the third capacitor electrode CPE3 of the second capacitor C2.

The sixth source electrode SE6 of the sixth transistor T6 may be electrically connected to the light emitting element ED of the first pixel SP1 through the second connection electrode CE2. For example, the sixth source electrode SE6 of the sixth transistor T6 may be electrically connected to the first pixel electrode PXE1 through the second connection electrode CE2. Accordingly, the sixth source electrode SE6 of the sixth transistor T6 may supply the driving current Id to the light emitting element ED through the first pixel electrode PXE1.

The sixth source electrode SE6 of the sixth transistor T6 may be connected to the fourth drain electrode DE4 of the fourth transistor T4. The sixth source electrode SE6 of the sixth transistor T6 may be an electrode integrated with the fourth drain electrode DE4 of the fourth transistor T4.

The first capacitor C1 may include the first capacitor electrode CPE1 and the second capacitor electrode CPE2.

The first capacitor electrode CPE1 of the first capacitor C1 may be disposed in the second conductive layer MTL2. The first capacitor electrode CPE1 may be connected to the second source electrode SE2 of the second transistor T2 and the third drain electrode DE3 of the third transistor T3 through the fifth connection electrode CE5. At least a part of the first capacitor electrode CPE1 may constitute the first gate electrode GE1 of the first transistor T1.

The second capacitor electrode CPE2 of the first capacitor C1 may be disposed in the first conductive layer MTL1. The second capacitor electrode CPE2 may be connected to the third capacitor electrode CPE3 of the second capacitor C2 through a contact hole penetrating the buffer film BF and the interlayer insulating film ILD. The second capacitor electrode CPE2 may be connected to the first source electrode SE1 of the first transistor T1 and the sixth drain electrode DE6 of the sixth transistor T6 through the third capacitor electrode CPE3.

The second capacitor C2 may include the third capacitor electrode CPE3 and the fourth capacitor electrode CPE4.

The third capacitor electrode CPE3 of the second capacitor C2 may be disposed in the third conductive layer MTL3. The third capacitor electrode CPE3 may be connected to the first source electrode SE1 of the first transistor T1 and the sixth drain electrode DE6 of the sixth transistor T6 through a contact hole penetrating the interlayer insulating film ILD. The third capacitor electrode CPE3 may be connected to the second capacitor electrode CPE2 of the first capacitor C1 through a contact hole penetrating the buffer film BF and the interlayer insulating film ILD.

The fourth capacitor electrode CPE4 of the second capacitor C2 may be disposed in the active layer ACTL. The fourth capacitor electrode CPE4 may be connected to the second horizontal reference power line HVRL2 through the fourth connection electrode CE4.

The area of the second capacitor electrode CPE2 may be larger than the area of the first capacitor electrode CPE1 and the area of the fourth capacitor electrode CPE4. The area of the third capacitor electrode CPE3 may be larger than the area of the first capacitor electrode CPE1 and the area of the fourth capacitor electrode CPE4. The second capacitor electrode CPE2 may overlap each of the first capacitor electrode CPE1 and the fourth capacitor electrode CPE4. The third capacitor electrode CPE3 may overlap each of the first capacitor electrode CPE1 and the fourth capacitor electrode CPE4. The first capacitor electrode CPE1 and the fourth capacitor electrode CPE4 may not overlap each other.

The first to fourth capacitor electrodes CPE1, CPE2, CPE3, and CPE4 may be surrounded by the first data line DL1, the first driving power line VDL, the first emission control line EML1, and the second horizontal reference power line HVRL2.

The first to fifth auxiliary electrodes AUE1 to AUE5 may have a shape extending in the second direction DR2. The first to fifth auxiliary electrodes AUE1 to AUE5 may respectively overlap power lines. For example, the first auxiliary electrode AUE1 may overlap the second driving power line VSL, the second auxiliary electrode AUE2 may overlap the first driving power line VDL, the third auxiliary electrode AUE1 may overlap the first reference power line VRL1, the fourth auxiliary electrode AUE4 may overlap the initialization power line VIL, and the fifth auxiliary electrode AUE5 may overlap the second reference power line VRL2. The display device 10 according to an embodiment may include the first to fifth auxiliary electrodes AUE1 to AUE5 respectively overlapping the power lines, so that the resistance applied to the respective power lines may be minimized.

In the display area DA, one second auxiliary electrode AUE2 may be disposed in every column, and each one of the first auxiliary electrode AUE1, the third auxiliary electrode AUE3, the fourth auxiliary electrode AUE4, and the fifth auxiliary electrode AUE5 may be disposed in every two columns.

The pixel electrode PXE may be connected to the second connection electrode CE2 through a contact hole penetrating the via film VIA and the passivation film PV. The pixel electrode PXE may be connected to the sixth source electrode SE6 of the sixth transistor T6 through the second connection electrode CE2 and a contact hole penetrating the via film VIA and the passivation film PV. The pixel electrode PXE may receive the driving current Id from the sixth source electrode SE6 of the sixth transistor T6.

The common electrode auxiliary electrode VCE may be electrically connected to the second driving power line VSL disposed in the circuit layer CCL through a contact hole penetrating the via film VIA and the passivation film PV. The common electrode auxiliary electrode VCE may receive the second pixel voltage ELVSS from the second driving power line VSL.

The display substrate 100 may further include a laser drilling area LDA including a laser drilling hole for electrically connecting the common electrode auxiliary electrode VCE to the common electrode CME. The laser drilling hole disposed in the laser drilling area LDA may penetrate the pixel defining film PDL. The common electrode auxiliary electrode VCE may be connected to the common electrode CME through the laser drilling hole. The common electrode auxiliary electrode VCE may provide the second pixel voltage ELVSS, which is provided from the second driving power line VSL through the contact hole penetrating the via film VIA and the passivation film PV, to the common electrode CME through the laser drilling hole.

In an embodiment, the common electrode auxiliary electrode VCE may include a first shielding part AUP1, a second shielding part AUP2, and a third shielding part AUP3. The first shielding part AUP1 may overlap the first data line DL1, the second shielding part AUP2 may overlap the second data line DL2, and the third shielding part AUP3 may overlap the third data line DL3.

The extension direction of the first shielding part AUP1, the second shielding part AUP2, and the third shielding part AUP3 may be the same as the extension direction of the data line DL. For example, each of the first shielding part AUP1, the second shielding part AUP2, and the third shielding part AUP3 may have a shape extending in the second direction DR2.

The display device 10 according to an embodiment may include the first shielding part AUP1, the second shielding part AUP2, and the third shielding part AUP3 respectively overlapping the first to third data lines DL1, DL2, and DL3, so that the coupling phenomenon between the first to third data lines DL1, DL2, and DL3 and adjacent wires may be prevented. Accordingly, the reliability of the pixel circuit PC may be improved.

In concluding the detailed description, those skilled in the art will appreciate that many variations and modifications can be made to the disclosed embodiments without substantially departing from the principles of the disclosure. Therefore, the disclosed embodiments are used in a generic and descriptive sense only and not for purposes of limitation.

What is claimed is:

1. An electronic device comprising:
a display device comprising:
    a first unit pixel comprising at least two light emitting elements;
    a second unit pixel comprising at least two light emitting elements; and
    a power line applying a voltage to the first unit pixel and the second unit pixel,
  wherein
    the first unit pixel and the second unit pixel are disposed side by side in a direction different from an extension direction of the power line,
    the power line comprises:
      first driving power lines;
      second driving power lines;
      an initialization power line;
      a first reference power line; and
      a second reference power line,
    the second driving power lines, the initialization power line, the first reference power line, and the second reference power line are each electrically connected to the first unit pixel and the second unit pixel through a wire, and
    the first driving power lines comprise wires electrically connected to each of the first unit pixel and the second unit pixel.

2. The electronic device of claim 1, wherein a number of the first driving power lines is greater than a number of the second driving power lines.

3. The electronic device of claim 2, wherein a voltage applied to the first driving power lines is higher than a voltage applied to the second driving power lines.

4. The electronic device of claim 1, wherein a width of each of the second driving power lines is greater than a width of each of the first driving power lines.

5. The electronic device of claim 4, wherein a width of each of the second driving power lines is greater than a width of each of the initialization power line, the first reference power line, and the second reference power line.

6. The electronic device of claim 1, further comprising:
a plurality of data lines each applying a data signal to the at least two light emitting elements of the first unit pixel and the second unit pixel,
  wherein at least one power line is disposed between the plurality of data lines.

7. The electronic device of claim 1, further comprising:
an auxiliary electrode extending in a same direction as the power line,
  wherein the auxiliary electrode overlaps the power line.

8. A display device comprising:
a first unit pixel comprising at least two light emitting elements;
a second unit pixel comprising at least two light emitting elements;
a power line applying a voltage to the first unit pixel and the second unit pixel; and
a horizontal power line extending in a direction different from an extension direction of the power line and electrically connecting the first unit pixel and the second unit pixel to the power line,
wherein
the first unit pixel and the second unit pixel are disposed side by side in a same direction as the extension direction of the power line,
the horizontal power line comprises:
  first horizontal driving power lines;
  second horizontal driving power lines;
  a horizontal initialization power line;
  a first horizontal reference power line; and
  a second horizontal reference power line,
the first horizontal reference power line and the second horizontal driving power lines are each electrically connected to the first unit pixel and the second unit pixel through a wire, and
the first horizontal driving power lines, the horizontal initialization power line, and the second horizontal reference power line each comprise wires electrically connected to each of the first unit pixel and the second unit pixel.

9. The display device of claim 8, wherein a number of the first horizontal driving power lines is greater than a number of the second horizontal driving power lines.

10. The display device of claim 8, wherein
a disposition of the first horizontal driving power lines, the horizontal initialization power line, and the second horizontal reference power line in the first unit pixel is substantially symmetrical to a disposition of the first horizontal driving power lines and the horizontal initialization power line, and the second horizontal reference power line in the second unit pixel with respect to a first reference line, and
the first reference line is disposed between the first unit pixel and the second unit pixel, and extends in a same direction as an extension direction of the horizontal power line.

11. The display device of claim 10, wherein
the first unit pixel and the second unit pixel each comprise at least one capacitor having at least one capacitor electrode, and
the capacitor electrode of the first unit pixel is substantially symmetrical to the capacitor electrode of the second unit pixel with respect to the first reference line.

12. A display device comprising:
at least one transistor and at least one capacitor disposed on a substrate;
at least one light emitting element disposed on the transistor and the capacitor, the at least one light emitting element comprising a first electrode, a light emitting layer disposed on the first electrode, and a second electrode disposed on the light emitting layer; and
a power line applying a voltage to any one of the transistor, the capacitor, and the at least one light emitting element, wherein the power line comprises first driving power lines applying a first voltage to the first electrode and second driving power lines applying a second voltage to the second electrode, and a number of first driving power lines is greater than a number of second driving power lines.

13. The display device of claim 12, wherein the first voltage is a voltage higher than the second voltage.

14. The display device of claim 12, wherein a number of the first driving power lines is twice a number of the second driving power lines.

15. The display device of claim 12, wherein a width of each of the second driving power lines is greater than a width of each of the first driving power lines.

16. The display device of claim 12, further comprising:

a plurality of data lines each applying a data signal to the at least one light emitting element; and a common electrode auxiliary electrode disposed in a same layer as the first electrode, wherein the common electrode auxiliary electrode comprises a plurality of shielding parts respectively overlapping the plurality of data lines.

17. The display device of claim 16, wherein an extension direction of the plurality of shielding parts is same as an extension direction of the plurality of data lines.

18. The display device of claim 12, further comprising:

a first conductive layer disposed on the substrate;

an active layer disposed on the first conductive layer;

a second conductive layer disposed on the active layer;

a third conductive layer disposed on the second conductive layer; and a fourth conductive layer disposed on the third conductive layer, wherein the at least one transistor comprises an active region, a source electrode, and a drain electrode, and a gate electrode disposed in the second conductive layer, the active region, the source electrode, and the drain electrode are disposed in the active layer, the at least one capacitor comprises capacitor electrodes respectively disposed on the first conductive layer, the active layer, the second conductive layer, and the third conductive layer, the power line is disposed in the third conductive layer, and the first electrode of the at least one light emitting element is disposed in the fourth conductive layer.

19. The display device of claim 18, further comprising:

a horizontal power line disposed in the first conductive layer and extending in a direction different from an extension direction of the power line, wherein the horizontal power line is electrically connected to the power line disposed in the third conductive layer through a contact hole.

20. The display device of claim 19, wherein the at least one transistor and the at least one capacitor are electrically connected to the power line through the horizontal power line.

\* \* \* \* \*